(12) United States Patent
Miyazaki et al.

(10) Patent No.: US 10,151,959 B2
(45) Date of Patent: Dec. 11, 2018

(54) FPC-ATTACHED OPTICAL MODULATOR AND OPTICAL TRANSMISSION DEVICE USING THE SAME

(71) Applicant: SUMITOMO OSAKA CEMENT CO., LTD., Tokyo (JP)

(72) Inventors: Norikazu Miyazaki, Tokyo (JP); Toru Sugamata, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 0 days.

(21) Appl. No.: 15/657,222

(22) Filed: Jul. 24, 2017

(65) Prior Publication Data

US 2018/0024411 A1    Jan. 25, 2018

(30) Foreign Application Priority Data

Jul. 25, 2016 (JP) .................. 2016-145342

(51) Int. Cl.
| | | |
|---|---|---|
| G02F 1/225 | (2006.01) | |
| H05K 1/02 | (2006.01) | |
| H05K 1/11 | (2006.01) | |
| G02F 1/01 | (2006.01) | |
| G02F 1/21 | (2006.01) | |
| H05K 3/30 | (2006.01) | |
| H05K 3/36 | (2006.01) | |

(52) U.S. Cl.
CPC .......... *G02F 1/2255* (2013.01); *G02F 1/0121* (2013.01); *H05K 1/0206* (2013.01); *H05K 1/028* (2013.01); *H05K 1/0274* (2013.01); *H05K 1/113* (2013.01); *H05K 1/118* (2013.01); *G02F 2001/212* (2013.01); *H05K 3/306* (2013.01); *H05K 3/363* (2013.01); *H05K 2201/0338* (2013.01); *H05K 2201/09036* (2013.01); *H05K 2201/09163* (2013.01); *H05K 2201/09181* (2013.01); *H05K 2201/09481* (2013.01); *H05K 2201/10121* (2013.01)

(58) Field of Classification Search
CPC ................................................. G02F 1/2255
See application file for complete search history.

(56) References Cited

U.S. PATENT DOCUMENTS

| | | | | |
|---|---|---|---|---|
| 2012/0114340 A1* | 5/2012 | Sugiyama | ............ | G02B 6/4201 398/200 |
| 2012/0120619 A1* | 5/2012 | Kodera | ................ | H05K 1/0219 361/749 |
| 2014/0119745 A1* | 5/2014 | Sugiyama | ............. | G02F 1/2255 398/188 |
| 2015/0261062 A1* | 9/2015 | Sugiyama | ................ | G02B 6/12 385/14 |

(Continued)

*Primary Examiner* — Sung H Pak
(74) *Attorney, Agent, or Firm* — JCIPRNET

(57) ABSTRACT

An optical modulator including a flexible printed circuit performing an electrical connection with an external circuit substrate, in which the flexible printed circuit includes a plurality of first pads and the like provided on one surface of the flexible printed circuit along one side of the flexible printed circuit, a plurality of second pads and the like provided on the other surface of the flexible printed circuit at locations that respectively correspond to the plurality of first pads, and a plurality of metal films and the like provided at locations that respectively correspond to the first pads on a side surface of the flexible printed circuit along the one side of the flexible printed circuit.

10 Claims, 22 Drawing Sheets

(56) References Cited

U.S. PATENT DOCUMENTS

| | | | |
|---|---|---|---|
| 2015/0261063 A1* | 9/2015 | Sugiyama | ............... G02F 1/225 385/2 |
| 2016/0011487 A1* | 1/2016 | Sugiyama | ............... G02F 1/225 385/3 |
| 2016/0246156 A1* | 8/2016 | Sugiyama | ............. G02F 1/2255 |
| 2016/0356955 A1* | 12/2016 | Sugiyama | .......... G02B 6/12002 |
| 2017/0104542 A1* | 4/2017 | Sugiyama | ............ H04B 10/501 |

* cited by examiner

| PAD FILM THICKNESS (μm) | 1 | 2 | 4 | 10 | 20 | 40 | 60 | 80 |
|---|---|---|---|---|---|---|---|---|
| UNIFORMITY/MAKEUP QUALITY | D | C | C | B | A | A | A | A |
| FPC FLEXIBILITY | A | A | A | A | A | A | B | C |

FPC-ATTACHED OPTICAL MODULATOR AND OPTICAL TRANSMISSION DEVICE USING THE SAME

CROSS-REFERENCE TO RELATED APPLICATIONS

This application claims the benefit of Japanese Patent Application No. 2016-145342 filed Jul. 25, 2016, the disclosure of which is herein incorporated by reference in its entirety.

BACKGROUND OF THE INVENTION

Field of the Invention

The present invention relates to an optical modulator and an optical transmission device and particularly to an optical modulator including a flexible printed circuit (FPC) for inputting radio frequency signals and an optical transmission device using the same.

Description of Related Art

In high-frequency/high-capacity optical fiber communication systems, optical modulators embedded with waveguide-type optical modulation elements are frequently used. Among these, optical modulation elements in which $LiNbO_3$ (hereinafter, also referred to as LN) having an electro-optic effect is used for substrates cause only a small light loss and are capable of realizing broad optical modulation characteristics and are thus widely used for high-frequency/high-capacity optical fiber communication systems.

In an optical modulation element in which this LN substrate is used, Mach-Zehnder-type optical waveguides, RF electrodes for applying radio frequency signals, which are modulation signals, to the optical waveguides, and bias electrodes for performing a variety of adjustments for favorably maintaining modulation characteristics in the waveguides are provided. In addition, these electrodes provided in the optical modulation element are connected to a circuit substrate on which electronic circuits for causing modulation operations in an optical modulator are mounted (hereinafter, abbreviated as circuit substrate) through lead pins or connectors provided in a package case of the optical modulator which accommodates the optical modulation element.

Regarding modulation methods in optical fiber communication systems, in response to the recent trend of an increase in transmission capacity, multilevel modulation or transmission formats achieved by incorporating polarization multiplexing into multilevel modulation such as Quadrature Phase Shift Keying (QPSK) or Dual Polarization-Quadrature Phase Shift Keying (DP-QPSK) has become mainstream and been used in core optical transmission networks and also has been introduced into metro networks.

Optical modulators performing QPSK modulation (QPSK optical modulators) or optical modulators performing DP-QPSK modulation (DP-QPSK optical modulators) include a plurality of Mach-Zehnder-type optical waveguides having a nested structure and include a plurality of radio frequency signal electrodes and a plurality of bias electrodes and thus tend to cause an increase in the sizes of package cases of the optical modulators, which creates a strong demand for, particularly, size reduction.

As a measure for satisfying the above-described demand for size reduction, an optical modulator in which push-on-type coaxial connectors provided in the package case of an optical modulator of the related art as interfaces of the RF electrodes are replaced by the same lead pins as the interfaces of the bias electrodes and a flexible printed circuit (FPC) for electrically connecting these lead pins to external circuit substrates is added is proposed.

For example, in a DP-QPSK optical modulator, an optical modulation element constituted of four Mach-Zehnder-type optical waveguides respectively having RF electrodes is used. In this case, four push-on-type coaxial connectors provided in the package case of the optical modulator inevitably increase the size of the package case, but the use of the lead pins and FPC instead of the coaxial connectors enables size reduction.

In addition, since the lead pins in the package case of the optical modulator and a circuit substrate on which electronic circuits for causing modulation operations in the optical modulator are mounted are connected to each other through the FPC, it is not necessary to perform the excess length treatment of coaxial cables used in the related art, and it is possible to decrease the installation space of the optical modulator in optical transmission devices.

FPC that is used in the optical modulator is produced using, for example, a flexible polyimide-based material as a substrate (hereinafter, FPC substrate), and a plurality of through-holes provided in the vicinity of one end portion are respectively electrically connected to individual pads provided in the other end portion through wire patterns. In addition, a plurality of the lead pins protruding from the bottom surface or side surfaces of the package case of the optical modulator are respectively inserted into the plurality of through-holes and are fixed by means of, for example, soldering and electrically connected to the through-holes, and the plurality of pads are fixed by means of, for example, soldering and connected to the circuit substrate. Therefore, radio frequency signals that are supplied from the pads on the circuit substrate are supplied to the corresponding RF electrodes in the optical modulation element through the respective corresponding through-holes and lead pins, whereby high-frequency optical modulation is performed.

As described above, the optical modulator in which FPC is used enables the size reduction of the package case and also a decrease in the installation space of the optical modulator on the circuit substrate and is thus capable of significantly contributing to the size reduction of optical transmission devices.

FIG. 20A, FIG. 20B, and FIG. 20C are views illustrating the constitution of a DP-QPSK optical modulator of the related art including the above-described FPC, FIG. 20A, FIG. 20B, and FIG. 20C are a top view, a front view, and a bottom view of the DP-QPSK optical modulator. This DP-QPSK optical modulator 2000 includes an optical modulation element 2002, a package case 2004 accommodating the optical modulation element 2002, a flexible printed circuit (FPC) 2006, an optical fiber 2008 for making light incident on the optical modulation element 2002, and an optical fiber 2010 guiding light output from the optical modulation element 2002 to the outside of the package case 2004.

In the package case 2004, four lead pins 2020, 2022, 2024, and 2026 that are respectively connected to four RF electrodes (not illustrated) in the optical modulation element 2002 are provided, and the lead pins 2020, 2022, 2024, and 2026 are inserted into through-holes 2120, 2122, 2124, and 2126 described below, which are provided in FPC 2006, and are fixed by means of, for example, soldering and electrically connected to the through-holes.

FIG. 21 is a view illustrating the constitution of FPC 2006. On one surface (the surface in the drawing, referred to as the front surface) of FPC 2006, four pads 2110, 2112, 2114, and 2116 are provided in parallel in the vicinity of one side 2102, the lower side in the drawing, along a direction of the side 2102. In addition, on a side of the other side 2104 opposite to the side 2102, four through-holes 2120, 2122, 2124, and 2126 are provided in parallel along, for example, a direction of the side 2104. Furthermore, the four pads 2110, 2112, 2114, and 2116 are respectively electrically connected to the through-holes 2120, 2122, 2124, and 2126 through wire patterns 2130, 2132, 2134, and 2136. Meanwhile, on a surface opposite to the front surface of FPC 2006 (rear surface), for example, no patterns are formed or a ground pattern (for example, so-called beta pattern) may be formed.

In addition, the four pads 2110, 2112, 2114, and 2116 are respectively fixed by means of, for example, soldering and electrically connected to the pads in the external circuit substrate, whereby the RF electrodes in the optical modulation element 2002 accommodated in the optical modulator 2000 and electronic circuits constituted on the circuit substrate are electrically connected to each other and are installed in an optical transmission device. Meanwhile, the shape of FPC 2006 is generally a horizontally long rectangular shape having short sides along a signal transmission direction as illustrated in FIG. 21 so as to extremely shorten the wire patterns and suppress microwave loss at a low level, and, in a case in which the four pads 2110, 2112, 2114, and 2116 are provided like the example illustrated in the drawing, the shape becomes a rectangular shape which is approximately 20 mm or less in the long side direction and approximately 10 mm or less in the short side direction.

FIG. 22A and FIG. 22B are views illustrating an example of a state of the optical modulator 2000 connected to the circuit substrate, FIG. 22A is a view of the optical modulator 2000 seen from the above, and FIG. 22B is a cross-sectional view in a direction of the XXIIB-XXIIB line in FIG. 22A. Meanwhile, in FIG. 22B, the internal constitution of the optical modulator 2000 is not illustrated.

The optical modulator 2000 and a circuit substrate 2200 are fixed to, for example, a base 2202 in the package case of the optical transmission device. As illustrated in FIG. 22A, FPC 2006 in the optical modulator 2000 extends from the connection portions with the lead pins 2020, 2022, 2024, and 2026 toward the left in the drawing and bends slantwise in the left downward direction in the drawing so as to come into contact with the circuit substrate 2200 at the left end portion as illustrated in FIG. 22B, whereby the pads 2110, 2112, 2114, and 2116 in FPC 2006 are fixed by means of, for example, soldering and electrically connected to pads 2210, 2212, 2214, and 2216 on the circuit substrate 2200 (FIG. 22A).

Meanwhile, as described above, in response to an increase in optical transmission capacity required for optical fiber communication systems, modulation operations required for optical modulators need to be performed at higher frequencies in broader bands, and, in a case in which complicated modulation operations such as DP-QPSK, which is means for achieving higher-frequency broader modulation operations, are performed, the number of signals lines input to optical modulators and, accordingly, the number of pads provided in FPC increases. On the other hand, the demand for the size reduction of optical modulators still remains unsatisfied, and thus the above-described increase in the number of necessary electrodes reduces the size of individual pads that are supposed to be formed on FPC. As an example, in ordinary DP-QPSK optical modulators, for example, the number of signal electrodes is four, and the size of pads formed on FPC is several hundreds of micrometers in width and approximately 1 mm in length.

The above-described demand for the size reduction of electrodes or pads may be further intensified on the basis of the request for an increase in optical transmission capacity. For example, for an additional increase in transmission capacity, studies are underway regarding a plurality of DP-QPSK modulation elements accommodated in one package case. In a case in which two DP-QPSK optical elements are accommodated in one package case, the number of pads for input electric signals increases from four to eight, but the size of the package case or the FPC substrate needs to remain almost unchanged. Therefore, the necessity for the additional size reduction of FPC and the size reduction of electrodes or pad portions may also be created.

In addition, for example, in a case in which an optical modulator is used in an optical transmission device for metro networks, the request for the size reduction of the device more strongly demands the size reduction of the optical modulator, and the necessity for the size reduction of pads may be created due to the size reduction or the like of FPC.

However, when the size of the pads formed on FPC is reduced, a slight variation in the state of the connection portions between the electrodes and, for example, the pads on the circuit substrate on which the optical modulator is installed (for example, the thickness or uniformity of solders used for the connection) may significantly change the propagation characteristics of radio frequencies in the connection portions. As a result, due to the variation in the state of the connection portions in each of a plurality of the pads formed on FPC, there may be a case in which a difference in radiofrequency propagation characteristics is caused between the electrodes, the quality of modulated light output from the optical modulator is degraded, and thus the optical transmission characteristics are adversely affected.

For example, in a case in which FPC 2006 is soldered to the circuit substrate 2200, as illustrated in FIG. 23A, the front surface (the lower-side surface in the drawing) of FPC 2006 is brought into contact with the circuit substrate 2200 through a soldering material (not illustrated) (for example, fused in advance on the pad 2210 and the like on the circuit substrate 2200), the front surface is pressed to the circuit substrate 2200 from the rear surface (the upper-side surface in the drawing) of FPC 2006 using a soldering iron 2300, and the soldering material interposed between FPC 2006 and the circuit substrate 2200 is fused, whereby the pad 2114 and the like in FPC 2006 and the pad 2214 and the like in the circuit substrate 2200 are fused and connected to each other. At this time, heat from the soldering iron 2300 is conducted in a substrate material portion (that is, poorly heat-conductive portion) in FPC 2006 in the thickness direction from the rear surface toward the front surface of FPC 2006 and then fuses the solder, and thus a case in which the heat from the soldering iron 2300 is not sufficiently transmitted to the solder due to process variations such as the pressing time or pressing location of the soldering iron 2300 may be caused, and, for example, the solder may float as illustrated in FIG. 23B. Therefore, the contact area between the pad 2110 and the like and the pad 2210 and the like varies, and the radio frequency propagation characteristics vary in the contact portion.

In addition, in a case in which the amount of the solder interposed between FPC 2006 and the circuit substrate 2200 is excessive, the solder may not be sufficiently fused or, as illustrated in FIG. 23B, the solder leaking from the contact portion between FPC 2006 and the circuit substrate 2200 may be solidified and locally present in an island shape on a conductor pattern of the circuit substrate 2200 (the island-shaped solidified portion of the solder is indicated by a reference sign 2302 in FIG. 23B). In a portion in which the solder is locally present in the above-described conductor pattern, the radio frequency impedance in the conductor pattern changes stepwise and causes manufacturing variations in the radio frequency propagation characteristics in the conductor pattern (therefore, in a case in which there are a plurality of the conductor patterns, the radio frequency propagation characteristics vary in the respective conductor patterns).

SUMMARY OF THE INVENTION

In consideration of the above-described background, in optical modulators including FPC performing an electrical connection with an external circuit substrate, it is desirable to suppress connection variations between the pads formed on FPC and the pads on the circuit substrate and thus effectively suppress variations in the radio frequency characteristics of signal paths including the connection portions between these pads.

An aspect of the present invention is an optical modulator including a flexible printed circuit performing an electrical connection with a circuit substrate, in which the flexible printed circuit includes a plurality of first pads provided on one surface of the flexible printed circuit along one side of the flexible printed circuit, a plurality of second pads provided on the other surface of the flexible printed circuit at locations that respectively correspond to the plurality of first pads, and a plurality of metal films provided at locations that respectively correspond to the first pads on a side surface of the flexible printed circuit along the one side of the flexible printed circuit.

According to the aspect of the present invention, each of the plurality of metal films is constituted of one metal film connecting one first pad of the plurality of first pads and one second pad of the plurality of second pads which correspond to each other or each of the plurality of metal films is constituted of a plurality of metal films including a metal film connected to the corresponding first pad and a metal film connected to the corresponding second pad.

According to the aspect of the present invention, the flexible printed circuit includes through-holes that thermally connect the plurality of first pads to the plurality of second pads.

According to the aspect of the present invention, a recess portion having a semi-circular shape in a plan view is provided on the side surface of the flexible printed circuit provided with the plurality of metal films, and the plurality of metal films is provided in a part of whole of an inner surface of the recess portion.

According to the aspect of the present invention, a recess portion having a semi-circular shape in a plan view is provided on the side surface of the flexible printed circuit provided with the plurality of metal films, and the plurality of metal films is provided in a region of the side surface including the recess portion.

According to the aspect of the present invention, a recess portion having a rectangular shape in a plan view is provided on the side surface of the flexible printed circuit provided with the plurality of metal films, and the plurality of metal films is provided in a part or whole of the inner surface of the recess portion.

According to the aspect of the present invention, the recess portion having the rectangular shape has a width equal to or, wider, narrower than a width of each of the plurality of first pads.

According to the aspect of the present invention, thicknesses of each of the plurality of first pads and each of the plurality of second pads are 10 μm or more and 60 μm or less.

Another aspect of the present invention is an optical transmission device including the above-described optical modulator; and an electronic circuit that outputs electrical signals for causing modulation operations in the optical modulator.

DETAILED DESCRIPTION OF THE INVENTION

Hereinafter, embodiments of the present invention will be described with reference to the accompanying drawings.

First Embodiment

Figure 1A:
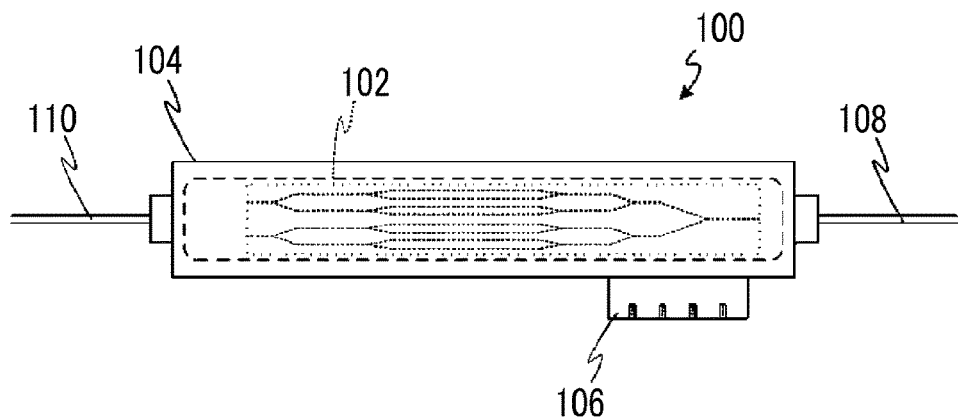
FIG. 1A is a top view of an optical modulator according to a first embodiment of the present invention.
Figure 1B:
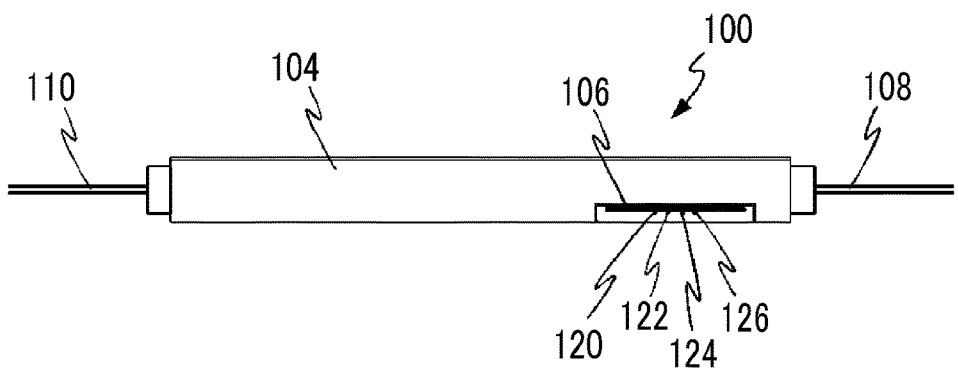
FIG. 1B is a side view of the optical modulator according to the first embodiment of the present invention.
Figure 1C:
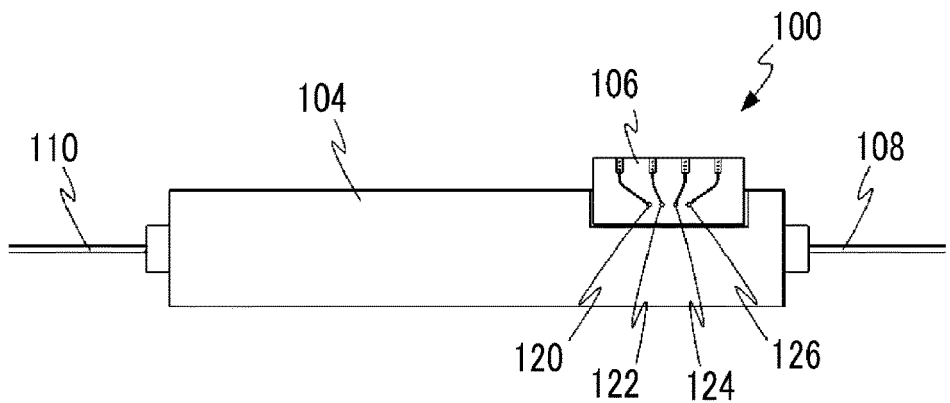
FIG. 1C is a bottom view of the optical modulator according to the first embodiment of the present invention.

FIG. 1A, FIG. 1B, and FIG. 1C are views illustrating the constitution of an optical modulator according to a first embodiment of the present invention.

The present optical modulator 100 includes an optical modulation element 102, a package case 104 accommodating the optical modulation element 102, a flexible printed circuit (FPC) 106, an optical fiber 108 for making light incident on the optical modulation element 102, and an optical fiber 110 guiding light output from the optical modulation element 102 to the outside of the package case 104.

The optical modulation element 102 is, for example, a DP-QPSK optical modulator including four Mach-Zehnder-type optical waveguides provided on an LN substrate and four radio frequency electrodes (RF electrodes) which are respectively provided on the Mach-Zehnder-type optical waveguides and modulate light waves propagating through the optical waveguides. Two light rays output from the optical modulation element 102 are polarization-synthesized using, for example, a lens optical system (not illustrated) and are guided to the outside of the package case 104 through the optical fiber 110.

The package case 104 includes four lead pins for signals 120, 122, 124, and 126 that are respectively connected to the four RF electrodes (not illustrated) in the optical modulation element 102. The lead pins for signals 120, 122, 124, and 126 provided in the package case 104 are inserted into through-holes for signals 220, 222, 224, and 226 described below, which are provided in FPC 106, and the through-holes for signals 220, 222, 224, and 226 and the lead pins for signals 120, 122, 124, and 126 are respectively connected and fixed to each other by means of, for example, soldering.

Figure 2A:
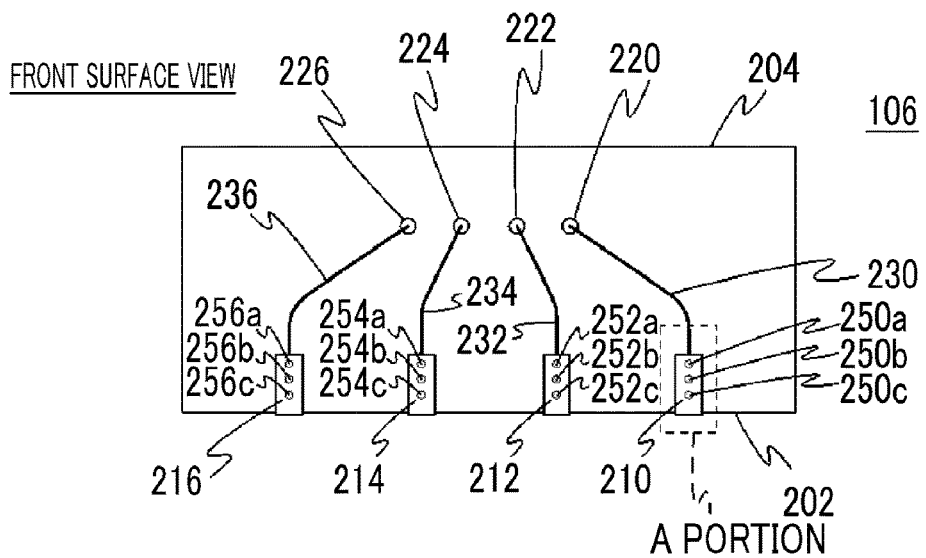
FIG. 2A is a view illustrating a front surface of FPC that is used in the optical modulator illustrated in FIG. 1A, FIG. 1B, and FIG. 1C.
Figure 2B:
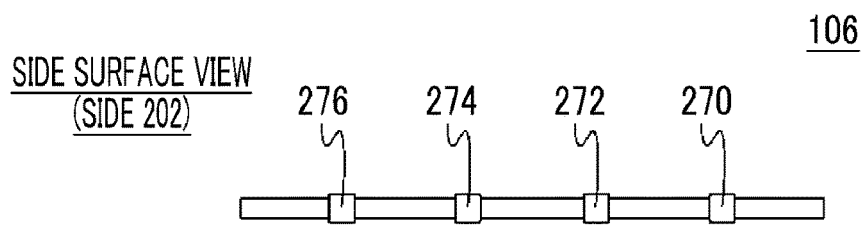
FIG. 2B is a view illustrating a side surface of FPC that is used in the optical modulator illustrated in FIG. 1A, FIG. 1B, and FIG. 1C.
Figure 2C:
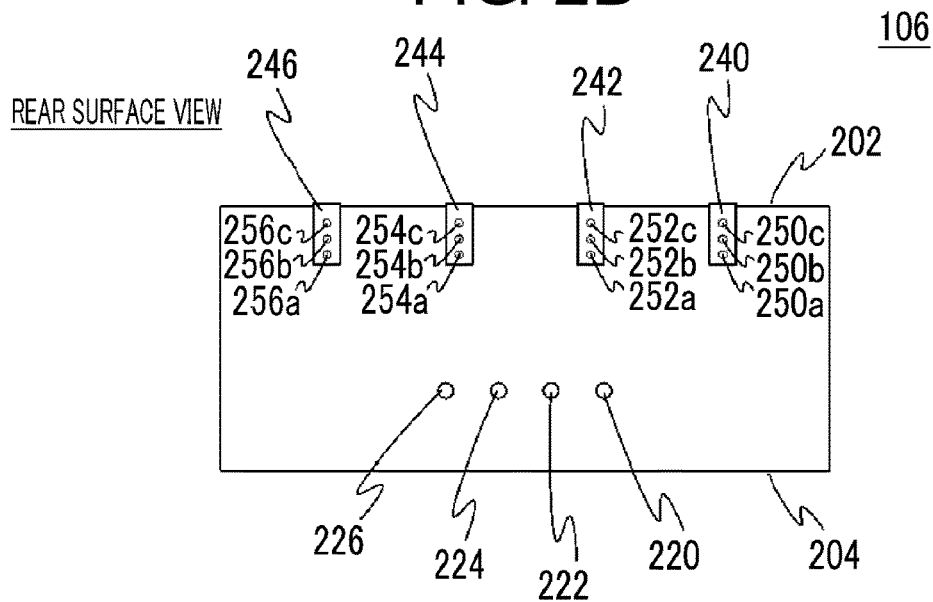
FIG. 2C is a view illustrating a rear surface of FPC that is used in the optical modulator illustrated in FIG. 1A, FIG. 1B, and FIG. 1C.
Figure 3:
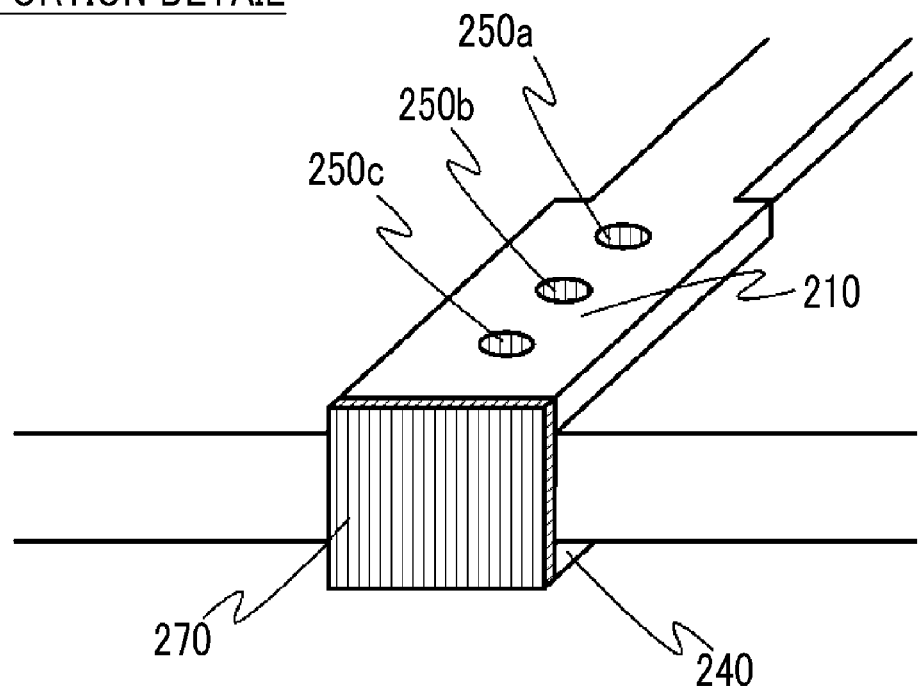
FIG. 3 is a perspective view illustrating detail of an A portion of FPC illustrated in FIG. 2A, FIG. 2B, and FIG. 2C.

FIG. 2A, FIG. 2B, and FIG. 2C are views illustrating the constitution of FPC 106. FIG. 2A is a view illustrating the constitution of one surface (referred to as the front surface) of FPC 106, FIG. 2B is a side surface view of FPC 106 along a side 202 illustrated in FIG. 2A, and FIG. 2C is a view illustrating the constitution of the other surface (referred to as the rear surface) of FPC 106. In addition, FIG. 3 is a perspective view of an A portion illustrated in FIG. 2A seen from the above.

FPC 106 is produced using, for example, a substrate made of polyimide as a main raw material (hereinafter, FPC substrate). FPC 106 is constituted in, for example, a rectangular shape in a plan view. As described above, the shape of FPC 106 is generally a horizontally long rectangular shape in order to extremely shorten wire patterns and suppress microwave loss at a low level. Therefore, in the present embodiment, similar to FPC 2006, FPC 106 forms a rectangular shape. However, the shape of FPC 106 is not limited thereto and may have an arbitrary shape.

On the front surface of FPC 106 illustrated in FIG. 2A, four pads 210, 212, 214, and 216 are provided in parallel in the vicinity of the side 202 along a direction of the side 202. In addition, on a side of the other side 204 opposite to the side 202, the four through-holes for signals 220, 222, 224, and 226 are provided in parallel along, for example, a direction of the side 204. Furthermore, the four pads 210, 212, 214, and 216 are respectively electrically connected to the through-holes for signals 220, 222, 224, and 226 through wire patterns 230, 232, 234, and 236.

As described above, the four through-holes for signals 220, 222, 224, and 226 are respectively connected to the four lead pins for signals 120, 122, 124, and 126 provided in the package case 104, and the pads 210, 212, 214, and 216 are respectively electrically connected to pads constituting a part of an electronic circuit provided on an external circuit substrate (by means of, for example, soldering), whereby radio frequency signals output from the electronic circuit are respectively applied to the four RF electrodes in the optical modulation element 102 through FPC 106 and the lead pins 120, 122, 124, and 126.

The wire patterns 230, 232, 234, and 236 provided in FPC 106 can be constituted using a well-known line structure as a signal line for radio frequencies such as a microstrip line, a coplanar line, or a grounded coplanar line, and a ground pattern can also be provided on FPC 106 according to the structure (not illustrated).

Similar to FPC 2006 of the related art, the size of FPC 106 may be, for example, approximately 20 mm or less in the long side direction (the direction of the side 202) and approximately 10 mm or less in the short side direction (a direction perpendicular to the side 202) in order to extremely shorten the wire patterns 230, 232, 234, and 236 and suppress microwave loss at a low level.

In addition, on the rear surface of FPC 106 illustrated in FIG. 2C, pads 240, 242, 244, and 246 are respectively provided at locations corresponding (or opposite) to the pads 210, 212, 214, and 216 on the front surface. Here, the pads 210, 212, 214, and 216 on the front surface respectively correspond to first pads, and the pads 240, 242, 244, and 246 on the rear surface respectively correspond to second pads.

Figure 4A:
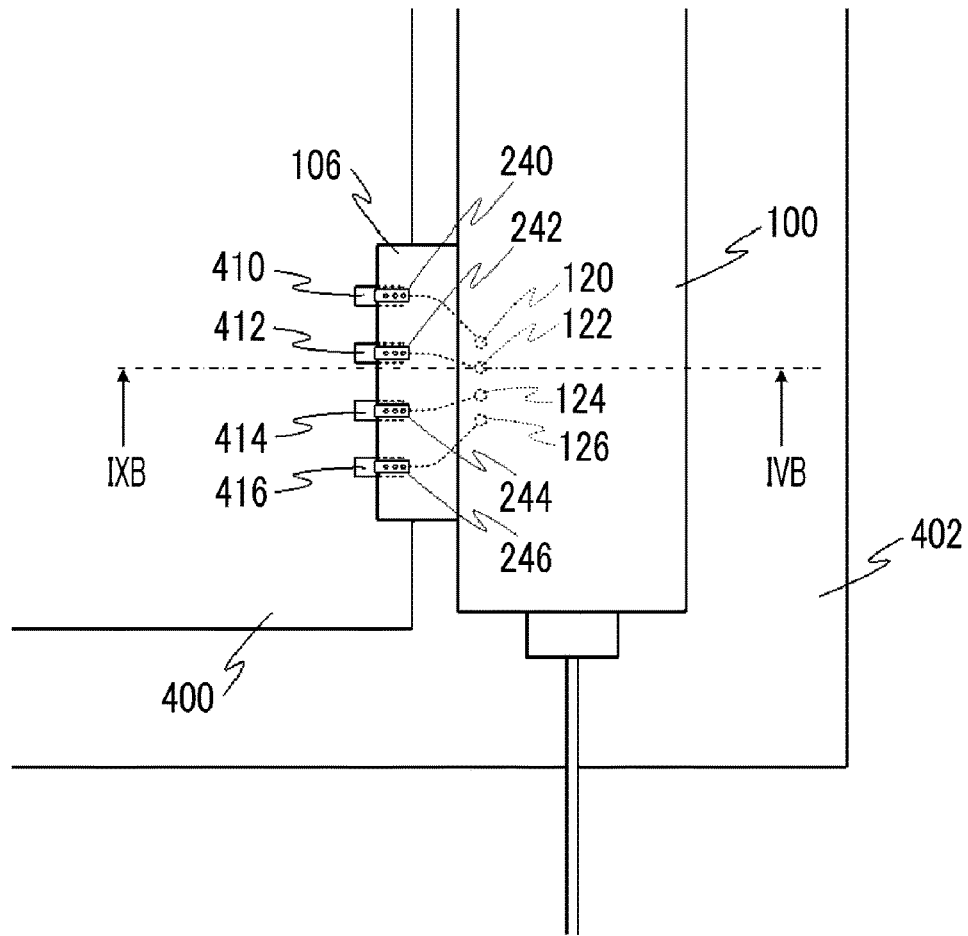
FIG. 4A is a view illustrating an example of a state of the optical modulator illustrated in FIG. 1A, FIG. 1B, and FIG. 1C connected to a circuit substrate on which an electronic circuit is constituted.
Figure 4B:
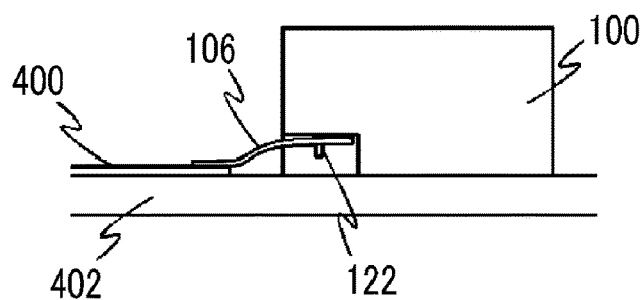
FIG. 4B is a cross-sectional view in a direction of IXB-IXB line of the optical modulator and the circuit substrate illustrated in FIG. 4A.

FIG. 4A and FIG. 4B are views illustrating an example of a state of the optical modulator 100 connected to a circuit substrate on which an electronic circuit is constituted, FIG. 4A is a view of the optical modulator 100 seen from the above, and FIG. 4B is a cross-sectional view in a direction of IXB-IXB line in FIG. 4A. Meanwhile, in FIG. 4B, the internal constitution of the optical modulator 100 is not illustrated.

The optical modulator 100 and a circuit substrate 400 are fixed to, for example, a base 402 in a package case of an optical transmission device. As illustrated in FIG. 4A, FPC 106 in the optical modulator 100 extends from the connection portions with the lead pins for signals 120, 122, 124, and 126 toward the left in the drawing and bends slantwise in the left downward direction in the drawing so as to come into contact with the circuit substrate 400 at the left end portion as illustrated in FIG. 4B, whereby the pads 210, 212, 214, and 216 provided at the locations on the circuit substrate 400 which respectively correspond to the pads 240, 242, 244, and 246 on the rear surface of FPC 106 are fixed by means of, for example, soldering and electrically connected to pads 410, 412, 414, and 416 on the circuit substrate 400 (in FIG. 4A, the pads 210, 212, 214, and 216 on the front surface are present at the locations overlaying the pads 240, 242, 244, and 246 on the rear surface and are thus not illustrated). In addition, while not illustrated, the optical modulator 100 may also be fixed onto the circuit substrate 400.

Particularly, in the optical modulator 100 of the present embodiment, as illustrated in FIG. 2A, FIG. 2B, and FIG. 2C, the pads 210, 212, 214, and 216 on the front surface of FPC 106 which are electrically connected to the pads 410, 412, 414, and 416 on the circuit substrate 400 are connected to the respectively corresponding pads 240, 242, 244, and 246 on the rear surface of FPC 106 through three through-holes 250a, 250b, and 250c, through-holes 252a, 252b, and 252c, through-holes 254a, 254b, and 254c, and through-holes 256a, 256b, and 256c respectively.

Here, the through-holes 250a, 250b, and 250c, the through-holes 252a, 252b, and 252c, the through-holes 254a, 254b, and 254c, and the through-holes 256a, 256b, and 256c respectively have metallized inner surfaces and/or are filled with conductive materials such as solder (that is, are constituted as vias), and thus the pads 210, 212, 214, and 216 on the front surface of FPC 106 are thermally connected to the respectively corresponding pads 240, 242, 244, and 246 on the rear surface of FPC 106 through these through-holes.

Furthermore, as illustrated in FIG. 2B and FIG. 3, the pads 210, 212, 214, and 216 on the front surface of FPC 106 and the respectively corresponding pads 240, 242, 244, and 246 on the rear surface of FPC 106 are also respectively thermally connected to each other through metal films 270, 272, 274, and 276 formed on a side surface (or end surface) of FPC 106 on the side 202 side. FIG. 3 illustrates, as an example, the pad 210 on the front surface and the pad 240 on the rear surface being connected to each other through the metal film 270 (the hatched portion in the drawing) provided on the side surface.

Therefore, in the present embodiment, in a case in which the pads 210, 212, 214, and 216 on the front surface of FPC 106 are solder-connected to the pads 410, 412, 414, and 416 on the circuit substrate 400, when a soldering iron is brought into contact with the respectively corresponding pads 240, 242, 244, and 246 on the rear surface of FPC 106, heat from the soldering iron is effectively transmitted to the pads 210, 212, 214, and 216 through the through-holes 250a, 250b, and 250c, the through-holes 252a, 252b, and 252c, the through-holes 254a, 254b, and 254c, the through-holes 256a, 256b, and 256c, and the metal films 270, 272, 274, and 276 provided in the side 202 of FPC 106.

Therefore, solder disposed between the pads 210, 212, 214, and 216 on FPC 106 and the pads 410, 412, 414, and 416 on the circuit substrate 400 is effectively heated, whereby the occurrence of the solder floating between the pads 410, 412, 414, and 416 on the circuit substrate 400 and the pads 210, 212, 214, and 216 on FPC 106 or the like is suppressed, and variations in the soldering connection state is suppressed.

As a result, variations in radio frequency propagation characteristics in the respective connection portions between the pads 210, 212, 214, and 216 and the pads 410, 412, 414, and 416 on the circuit substrate 400 are suppressed, and thus the favorable modulation operations of the optical modulator 100 are secured.

Figures 5, 6:
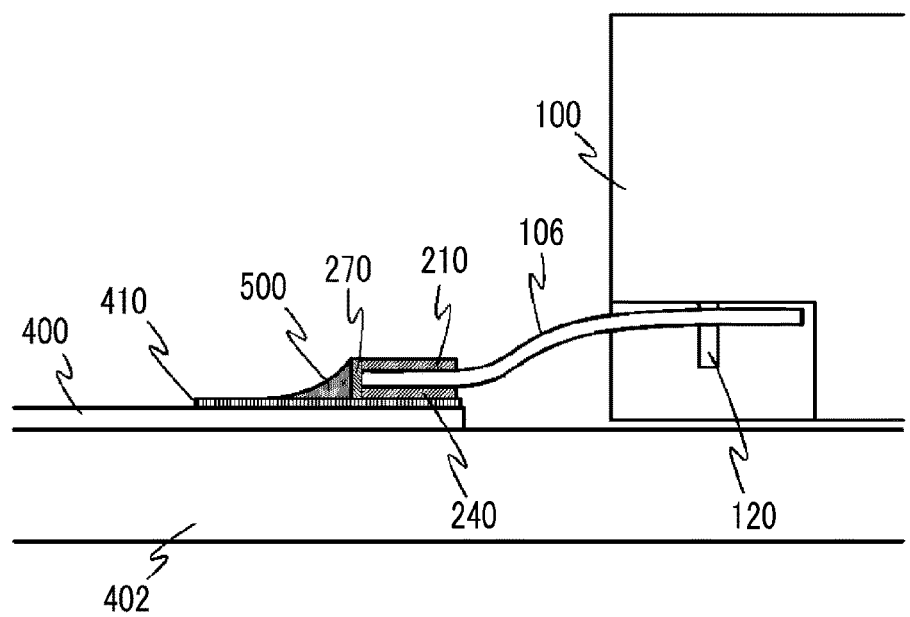
FIG. 5 is a view illustrating an example of a solder shape around a pad in FPC in the optical modulator illustrated in FIG. 1A, FIG. 1B, and FIG. 1C.
FIG. 6 is a table showing evaluation results regarding a relationship among a film thickness of a metal film constituting the pad in FPC, uniformity and makeup quality of solder connection portions, and flexibility of FPC in the optical modulator illustrated in FIG. 1A, FIG. 1B, and FIG. 1C.
Figure 23A:
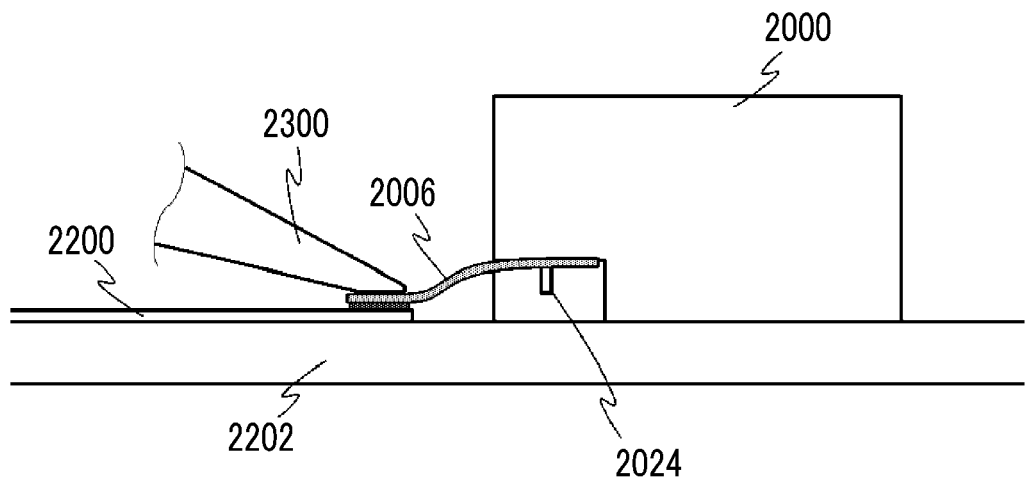
FIG. 23A is a view illustrating an example of a solder connection shape in an FPC portion in the optical modulator of the related art illustrated in FIG. 20A, FIG. 20B, and FIG. 20C.
Figure 23B:
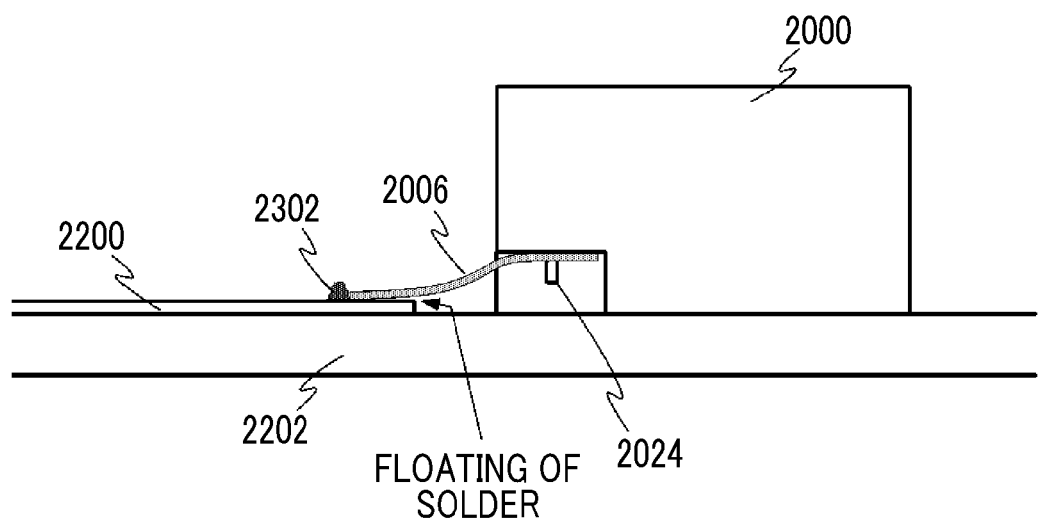
FIG. 23B is a view illustrating the example of the solder connection shape in the FPC portion in the optical modulator of the related art illustrated in FIG. 20A, FIG. 20B, and FIG. 20C.

Furthermore, in the present embodiment, since the metal films 270, 272, 274, and 276 are provided at the end portion of the side 202 of FPC 106, for example, even in a case in which the amount of the fused solder (fused solder) interposed between, FPC 106 and the circuit substrate 400 is great, and the fused solder leaks from the region of the metal film such as the pad 210, the leaked excess fused solder comes into contact with the metal film 270 and the like at the end portion of the side 202 as illustrated in FIG. 5, forms a smoothly curved surface (meniscus) due to the surface tension of the fused solder, and solidifies (an example of the solidified solder is indicated by reference sign 500 in FIG. 5). Therefore, in the present embodiment, there are no cases in which solder is locally present (refer to FIG. 23B) on a conductor pattern (for example, the pad 410 and the like) as in the related art, and the radio frequency impedance along the conductor pattern does not easily change stepwise. In addition, the shape of the solder in the connection portion between the pad 210 or the like and the pad 410 or the like on the circuit substrate 400 has the above-described meniscus curved surface and becomes a shape with a slight variation, and thus variations in radio frequency propagation characteristics in the connection portions and the peripheries thereof are further suppressed in association with the effect of suppressing the floating of solder and the like.

Meanwhile, the heating of the pads 210, 212, 214, and 216 on the front surface from the pads 240, 242, 244, and 246 on the rear surface of FPC 106 becomes more favorable as the film thickness of the metal film forming the pads (for example, gold (Au)) increases, and the thermal conductivity and the heat capacity increase; however, when the film thickness becomes thick, the flexibility of FPC 106 in the pad portions degrades, the adhesiveness between the pads 210, 212, 214, and 216 and the pads 410, 412, 414, and 416 on the circuit substrate 400 degrades during soldering operations, and, conversely, the connection states of the solder connection portions deteriorate.

FIG. 6 illustrates the results of the uniformity and makeup quality of the solder connection portions between the pads 210, 212, 214, and 216 on FPC 106 and the pads 410, 412, 414, and 416 on the circuit substrate 400 and the flexibility of FPC 106 during solder connection operations evaluated with varied film thicknesses of the metal films constituting the pads 210, 212, 214, and 216. Here, the metal used for the pad 210 and the like on FPC 106 is gold (Au), and the width and length of the pad 210 or the like are 350 µm and 1.3 mm respectively.

The uniformity and makeup quality of the solder connection portions and the flexibility of FPC 106 were determined in four levels of A (extremely favorable), B (favorable), C (not sufficient), and D (poor). The uniformity and makeup quality of the solder connection portions were determined on the basis of "Quality Determination Standards in Certification Tests of Micro-soldering Technologies" (JWES-MS060801J) established by The Japan Welding Engineering Society in consideration of the uniformity of makeup. These quality determination standards are based on the quality standards of highly reliable devices described in JIS C 61191 "Printed Substrate Assemblies" and prescribe more specific quality determination standards than the required standards of JIS. In addition, the flexibility of FPC 106 was evaluated by the floating, slant fixation, misalignment, and the like of solder joints (for example, the portion of the pad 240 in FIG. 5).

In the above-described evaluation results, it was found that the uniformity and makeup quality of the solder connection portions become favorable at a metal film thickness of the pad 210 and the like of 10 µm or more, but the flexibility of FPC 106 deteriorates, and the workability degrades at a metal film thickness of more than 60 µm. Therefore, the metal film thicknesses of the pads provided on FPC are desirably 10 µm or more and 60 µm or less. For example, in the optical modulator 100 according to the present embodiment, the pads 210, 212, 214, and 216 are constituted using thick gold (Au) films having a thickness of 40 µm.

Metal (for example, gold (Au)) films constituting pads formed on FPC are generally thin films having a thickness of approximately several micrometers from the viewpoint of the man-hours of production processes or material costs, but the preferred metal film thickness obtained from the above-described evaluations is approximately ten times thereof.

Generally, in a case in which the amount of solder is too great or the heating time is too long compared with the film thickness of metal constituting pads, a so-called "(solder) erosion" phenomenon in which the metal constituting the pads elutes into the solder, and the pads disappear (or, in a case in which the pads have a bilayer structure made of different kinds of metal, the upper layer metal elutes, and only the underlying metal remains) occurs, and the solder is likely to float between pads on FPC and pads on circuit substrates. Particularly, in the case of small pads having a width of 1 mm or less and a length of approximately 1 mm as used on FPC in optical modulators, it is difficult to accurately control the amount of solder to be used to the optimal amount, and, generally, the amount of solder tends to increase in order to avoid poor connection caused by the lack of solder. Furthermore, in FPC used for optical modulators, it is necessary to simultaneously or continuously solder-connect a plurality of pads to pads on circuit substrates, and thus the heating time of the pad-arranged portions on FPC tends to increase so that all of the pads are heated to a temperature necessary for solder fusion. As a result, in a case in which thin metal films having a thickness of approximately several micrometers are used as pads provided on FPC that is used in optical modulators as in the related art, the solder erosion phenomenon is likely to occur in the pads.

In contrast, in the optical modulator 100 according to the present embodiment, the pads 210, 212, 214, and 216 on FPC 106 are constituted using thick metal films having a thickness of 10 to 60 µm as described above, and thus the occurrence of poor solder connection (for example, the floating of solder) between the pads and the pads on the circuit substrate attributed to the above-described solder erosion phenomenon is further suppressed in association with an effect of the above-described efficient heating from the rear surface toward the front surface of FPC.

Next, modification examples of the present embodiment will be described using FIG. 7A, FIG. 7B, FIG. 7C, FIG. 8, FIG. 9A, FIG. 9B, FIG. 9C, FIG. 10, FIG. 11A, FIG. 11B, FIG. 11C, FIG. 12, FIG. 13A, FIG. 13B, FIG. 13C, FIG. 14, FIG. 15A, FIG. 15B, FIG. 15C, FIG. 16, FIG. 17A, FIG. 17B, FIG. 17C, and FIG. 18. FPC described below can be used in the optical modulator 100 instead of FPC 106.

First Modification Example

First, a first modification example of FPC 106 that is used in the optical modulator 100 illustrated in FIG. 1A, FIG. 1B, and FIG. 1C will be described.

In FPC 106 illustrated in FIG. 2A, FIG. 2B, FIG. 2C, and FIG. 3, the pad 210 and the like on the front surface and the pad 240 and the like on the rear surface are connected to each other through the metal film 270 and the like provided on the flat side surface along the side 202, and heat from the pad 240 and the like heated using, for example, a soldering iron is transmitted to the pad 210 and the like through the metal film 270 and the like, whereby the pad 210 and the like and the pad 410 and the like on the circuit substrate 400 are solder-connected to each other.

In contrast, in the present modification example, recess portions having a semi-circular shape in a plan view (seen from, for example, the front surface side) are provided in at least some of the side surface portion of FPC which is provided with the metal films connecting the pads on the front surface and the rear surface, and the metal films are formed on the side surface portion including the recess portion.

Figure 7A:
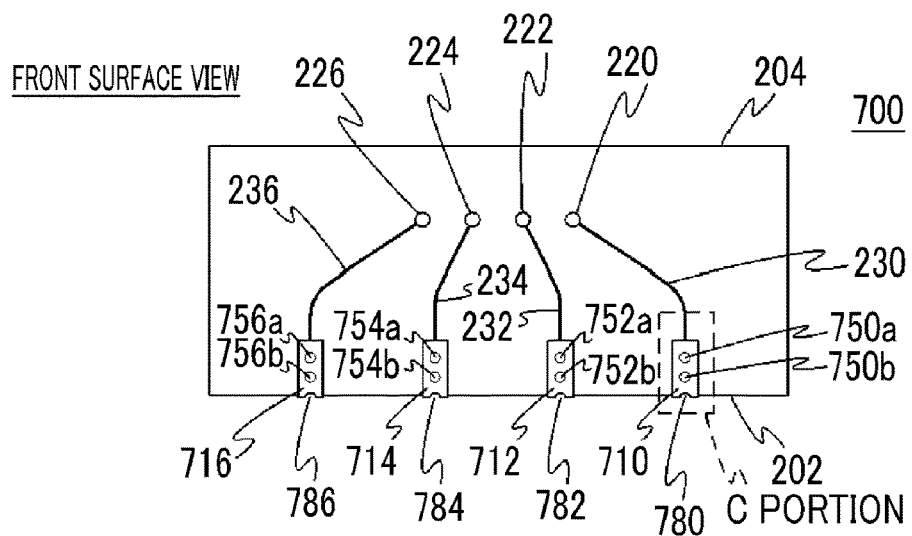
FIG. 7A is a view illustrating a front surface of a first modification example of FPC used in the optical modulator illustrated in FIG. 1A, FIG. 1B, and FIG. 1C.
Figure 7B:
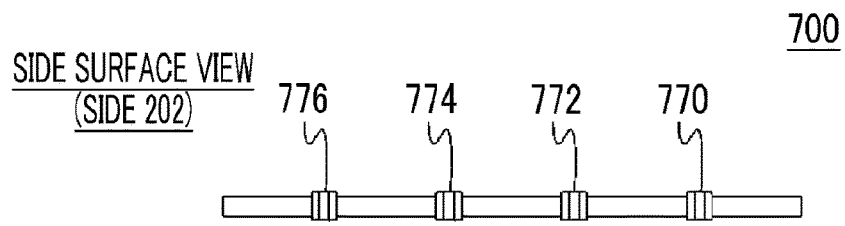
FIG. 7B is a view illustrating a side surface of the first modification example of FPC used in the optical modulator illustrated in FIG. 1A, FIG. 1B, and FIG. 1C.
Figure 7C:
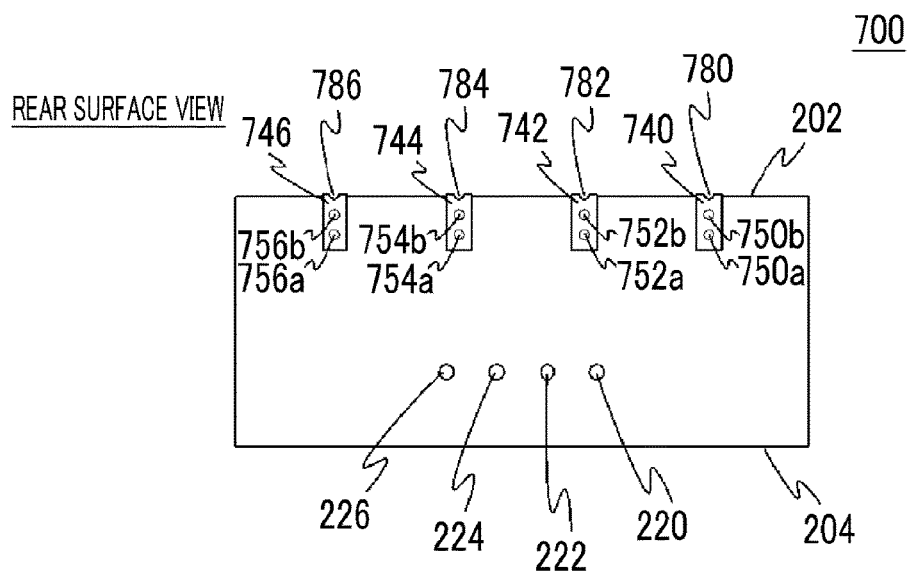
FIG. 7C is a view illustrating a rear surface of the first modification example of FPC used in the optical modulator illustrated in FIG. 1A, FIG. 1B, and FIG. 1C.

FIG. 7A, FIG. 7B, and FIG. 7C are views illustrating the constitution of FPC 700 according to the present modification example which can be used instead of FPC 106. Meanwhile, in FIG. 7A, FIG. 7B, and FIG. 7C, the same constituent elements as those of FPC 106 illustrated in FIG. 2A, FIG. 2B, and FIG. 2C will be represented by the same reference sign in FIG. 2A, FIG. 2B, and FIG. 2C, and the above description regarding FIG. 2A, FIG. 2B, and FIG. 2C will be incorporated.

Figure 8:
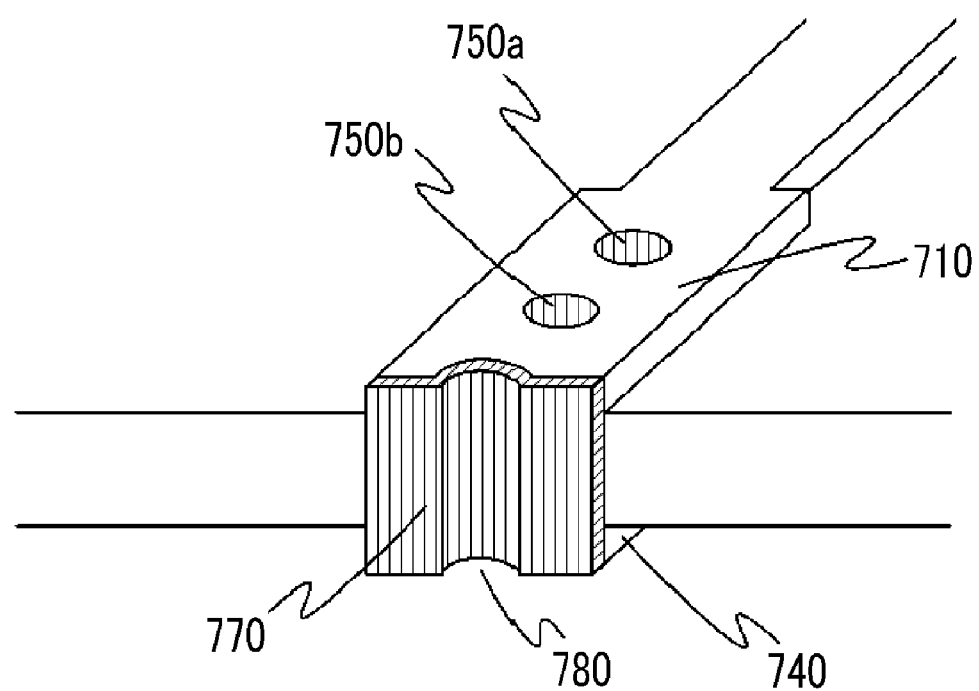
FIG. 8 is a perspective view illustrating detail of a C portion of FPC illustrated in FIG. 7A, FIG. 7B, and FIG. 7C.

FIG. 7A is a view illustrating the constitution of one surface (referred to as the front surface) of FPC 700, FIG. 7B is a side surface view of FPC 700 along the side 202 illustrated in FIG. 7A, and FIG. 7C is a view illustrating the constitution of the other surface (referred to as the rear surface) of FPC 700. In addition, FIG. 8 is a perspective view illustrating detail of a C portion illustrated in FIG. 7A.

FPC 700 illustrated in FIG. 7A, FIG. 7B, and FIG. 7C has the same constitution as FPC 106 illustrated in FIG. 2A, FIG. 2B, and FIG. 2C; however, on the front surface, pads 710, 712, 714, and 716 are provided instead of the pads 210, 212, 214, and 216. In addition, on the rear surface, pads 740, 742, 744, and 746 are provided instead of the pads 240, 242, 244, and 246.

In addition, the pads 710, 712, 714, and 716 on the front surface of FPC 700 and the respectively corresponding pads 740, 742, 744, and 746 on the rear surface of FPC 700 are connected to each other through two through-holes 750a and 750b, through-holes 752a and 752b, through-holes 754a and 754b, and through-holes 756a and 756b respectively.

Here, the through-holes 750a and 750b, the through-holes 752a and 752b, the through-holes 754a and 754b, and the through-holes 756a and 756b respectively have metallized inner surfaces and/or are filled with conductive materials such as solder, and thus the pads 710, 712, 714, and 716 on the front surface of FPC 700 are thermally connected to the respectively corresponding pads 740, 742, 744, and 746 on the rear surface of FPC 700 through these through-holes.

In addition, in FPC 700, metal films 770, 772, 774, and 776 are provided at locations that respectively correspond to the pads 710, 712, 714, and 716 on the side surface along the side 202, and the pads 710, 712, 714, and 716 on the front surface are respectively thermally connected to the pads 740, 742, 744, and 746 on the rear surface through these metal films. FIG. 8 illustrates, as an example, the pad 710 on the front surface and the pad 740 on the rear surface being connected to each other through the metal film 770 (the hatched portion in the drawing) provided on the side surface.

Particularly, in FPC 700 according to the present modification example, four recess portions 780, 782, 784, and 786 having a semi-circular shape in a plan view (seen from, for example, the front surface) are respectively provided in the portions provided with the metal films 770, 772, 774, and 776 out of the side surface of FPC 700 along the side 202. Therefore, in the present modification example, solder leaking from the side 202 side end portions of the pads 710, 712, 714, and 716 enters the recess portions 780, 782, 784, and 786 due to the capillary phenomenon, form meniscus curved surfaces in a state of being joined to the metal films 770, 772, 774, and 776, and solidify, and thus it is possible to effectively prevent the leaked solder from flowing into the pads 410, 412, 414, and 416 on the circuit substrate 400. As a result, in the present modification example, compared with FPC 106, the variation in the solder shapes (shapes after solidification) in the connection portions between the pads 710, 712, 714, and 716 and the pads 410, 412, 414, and 416 on the circuit substrate 400 decreases, and stable radio frequency propagation characteristics can be obtained.

Second Modification Example

Next, a second modification example of FPC 106 that is used in the optical modulator 100 illustrated in FIG. 1A, FIG. 1B, and FIG. 1C will be described.

In FPC 700 according to the second modification example illustrated in FIG. 7A, FIG. 7B, and FIG. 7C, recess portions 780, 782, 784, and 786 are provided on the side surface along the side 202, and the pads 710, 712, 714, and 716 on the front surface and the pads 740, 742, 744, and 746 on the rear surface are thermally connected to each other through the metal films 770, 772, 774, and 776 provided in a region in the side surface portion including these recess portions.

In contrast, in the present modification example, the metal films that thermally connect the pads on the front surface and the rear surface to each other are formed only on the inner surfaces of the recess portions provided on the side surface of FPC and throughout the entire surface of the recess portion inner surfaces.

Figure 9A:
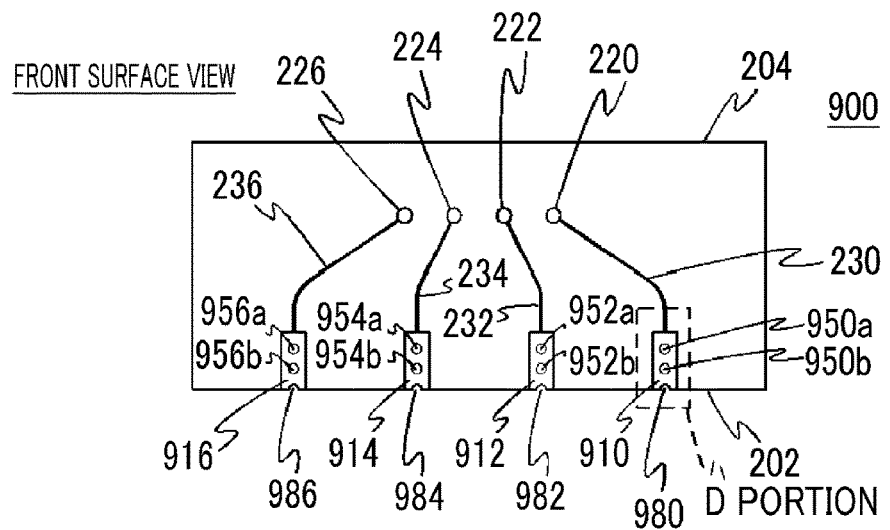
FIG. 9A is a view illustrating a front surface of a second modification example of FPC used in the optical modulator illustrated in FIG. 1A, FIG. 1B, and FIG. 1C.
Figure 9B:
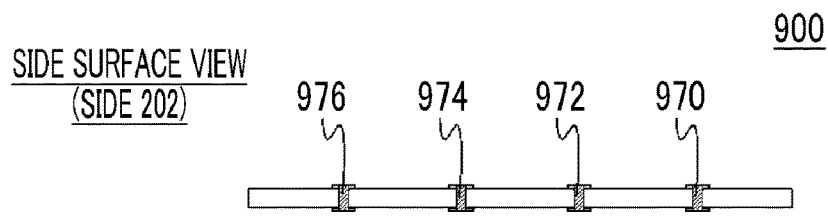
FIG. 9B is a view illustrating a side surface of the second modification example of FPC used in the optical modulator illustrated in FIG. 1A, FIG. 1B, and FIG. 1C.
Figure 9C:
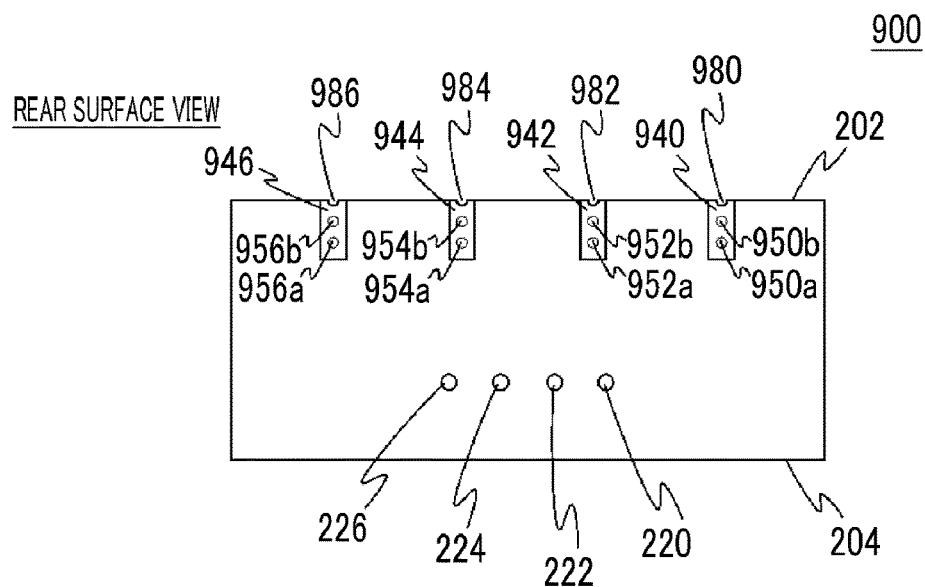
FIG. 9C is a view illustrating a rear surface of the second modification example of FPC used in the optical modulator illustrated in FIG. 1A, FIG. 1B, and FIG. 1C.

FIG. 9A, FIG. 9B, and FIG. 9C are views illustrating the constitution of FPC 900 according to the present modification example which can be used instead of FPC 106. Meanwhile, in FIG. 9A, FIG. 9B, and FIG. 9C, the same constituent elements as those of FPC 106 illustrated in FIG. 2A, FIG. 2B, and FIG. 2C will be represented by the same reference sign in FIG. 2A, FIG. 2B, and FIG. 2C, and the above description regarding FIG. 2A, FIG. 2B, and FIG. 2C will be incorporated.

Figure 10:
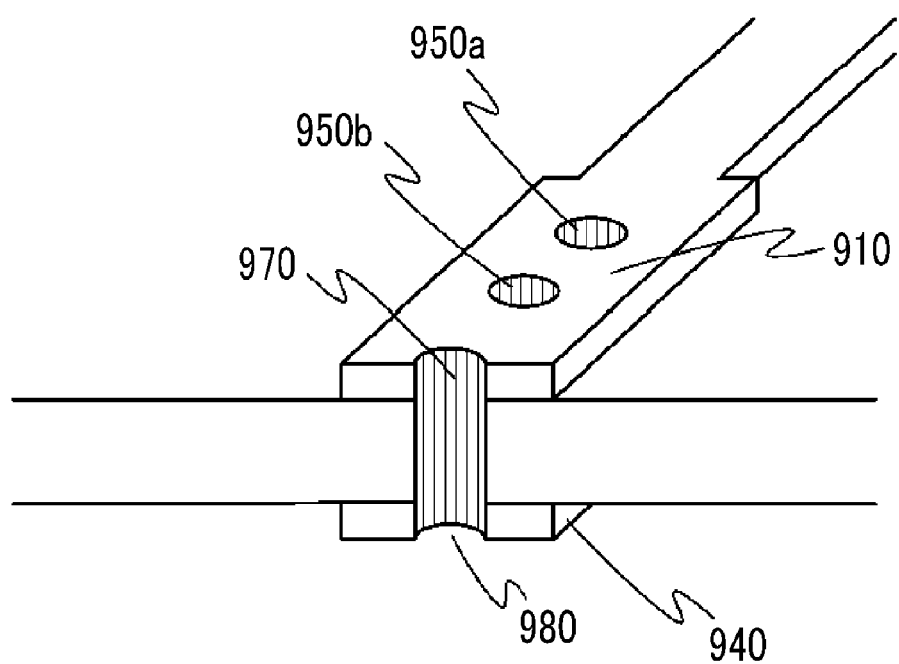
FIG. 10 is a perspective view illustrating detail of a D portion of FPC illustrated in FIG. 9A, FIG. 9B, and FIG. 9C.

FIG. 9A is a view illustrating the constitution of one surface (referred to as the front surface) of FPC 900, FIG. 9B is a side surface view of FPC 900 along the side 202 illustrated in FIG. 9A, and FIG. 9C is a view illustrating the constitution of the other surface (referred to as the rear surface) of FPC 900. In addition, FIG. 10 is a perspective view illustrating detail of a D portion illustrated in FIG. 9A.

FPC 900 illustrated in FIG. 9A, FIG. 9B, and FIG. 9C has the same constitution as FPC 106 illustrated in FIG. 2A, FIG. 2B, and FIG. 2C; however, on the front surface, pads 910, 912, 914, and 916 are provided instead of the pads 210, 212, 214, and 216. In addition, on the rear surface, pads 940, 942, 944, and 946 are provided instead of the pads 240, 242, 244, and 246.

In addition, the pads 910, 912, 914, and 916 on the front surface of FPC 900 and the respectively corresponding pads 940, 942, 944, and 946 on the rear surface of FPC 900 are connected to each other through two through-holes 950a and 950b, through-holes 952a and 952b, through-holes 954a and 954b, and through-holes 956a and 956b respectively.

Here, the through-holes 950a and 950b, the through-holes 952a and 952b, the through-holes 954a and 954b, and the through-holes 956a and 956b respectively have metallized inner surfaces and/or are filled with conductive materials such as solder, and thus the pads 910, 912, 914, and 916 on the front surface of FPC 900 are thermally connected to the respectively corresponding pads 940, 942, 944, and 946 on the rear surface of FPC 900 through these through-holes.

In addition, in FPC 900, four recess portions 980, 982, 984, and 986 having a semi-circular shape in a plan view (seen from, for example, the front surface) are provided at locations that respectively correspond to the pads 910, 912, 914, and 916 on the side surface along the side 202. In addition, metal films 970, 972, 974, and 976 (the hatched portion in the drawing) are provided only on the inner surfaces of the recess portions 980, 982, 984, and 986 and throughout the entire surface of the inner surfaces, and the pads 910, 912, 914, and 916 on the front surface and the pads 940, 942, 944, and 946 on the rear surface are respectively thermally connected to each other through these metal films. FIG. 10 illustrates, as an example, the pad 910 on the front surface and the pad 940 on the rear surface being connected to each other through the metal film 970 (the hatched portion in the drawing) provided on the side surface.

Therefore, in FPC 900 of the present modification example, similar to FPC 700 according to the first modification example illustrated in FIG. 7A, FIG. 7B, and FIG. 7C, solder leaking from the pads enters the recess portions 980, 982, 984, and 986 due to the capillary phenomenon, form meniscus curved surfaces in a state of being joined to the metal films 770, 772, 774, and 776, and solidify, and thus stable radio frequency propagation characteristics can be obtained by decreasing the variation in the shapes of the solder connection portions. In addition, the recess portions 980, 982, 984, and 986 can be easily provided by, for example, cutting a large-sized FPC so that the recess portions run through the center of through-holes provided in the large-sized FPC and producing FPC 900 using the cut surface as the side 202, and thus FPC 900 can be more easily produced than FPC 700 according to the first modification example illustrated in FIG. 7A, FIG. 7B, and FIG. 7C.

Third Modification Example

Next, a third modification example of FPC 106 that is used in the optical modulator 100 illustrated in FIG. 1A, FIG. 1B, and FIG. 1C will be described.

In FPC 900 according to the third modification example illustrated in FIG. 9A, FIG. 9B, and FIG. 9C, recess portions 980, 982, 984, and 986 are provided on the side surface along the side 202, and pads 910, 912, 914, and 916 on the front surface and pads 940, 942, 944, and 946 on the rear surface are thermally connected to each other through metal films 970, 972, 974, and 976 which are provided only on the inner surfaces of these recess portions and throughout the entire surface of the recess portion inner surfaces.

In contrast, in the present modification example, metal films that thermally connect the pads on the front surface and the rear surface to each other are formed only on some of the inner surfaces of the recess portions provided on the side surface of FPC.

Figure 11A:
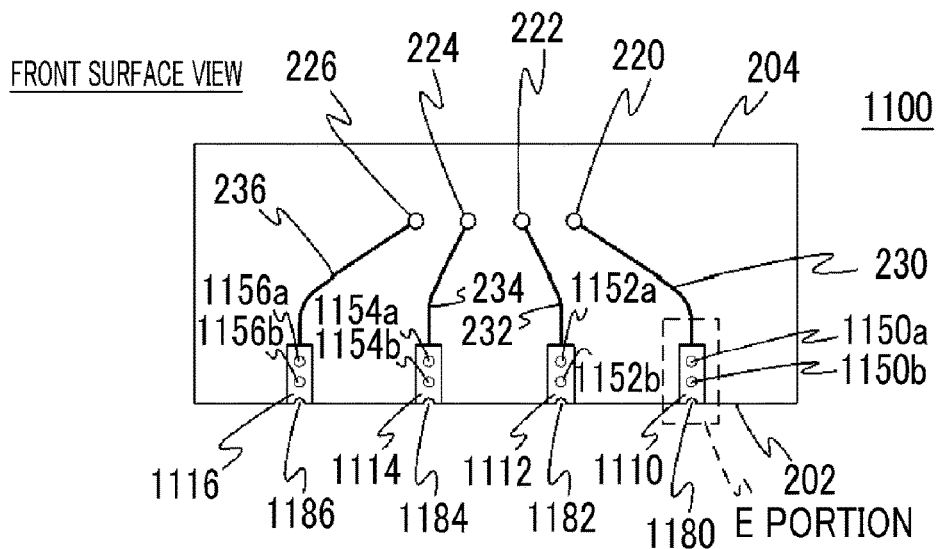
FIG. 11A is a view illustrating a front surface of a third modification example of FPC used in the optical modulator illustrated in FIG. 1A, FIG. 1B, and FIG. 1C.
Figure 11B:
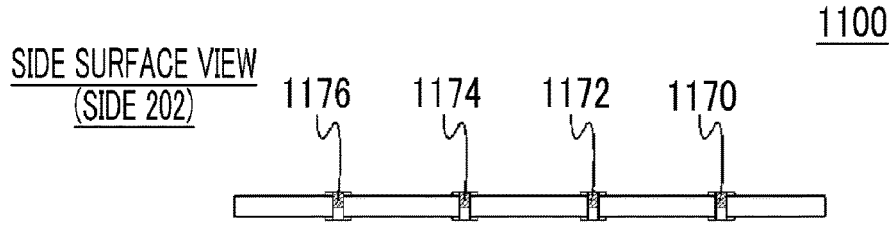
FIG. 11B is a view illustrating a side surface of the third modification example of FPC used in the optical modulator illustrated in FIG. 1A, FIG. 1B, and FIG. 1C.
Figure 11C:
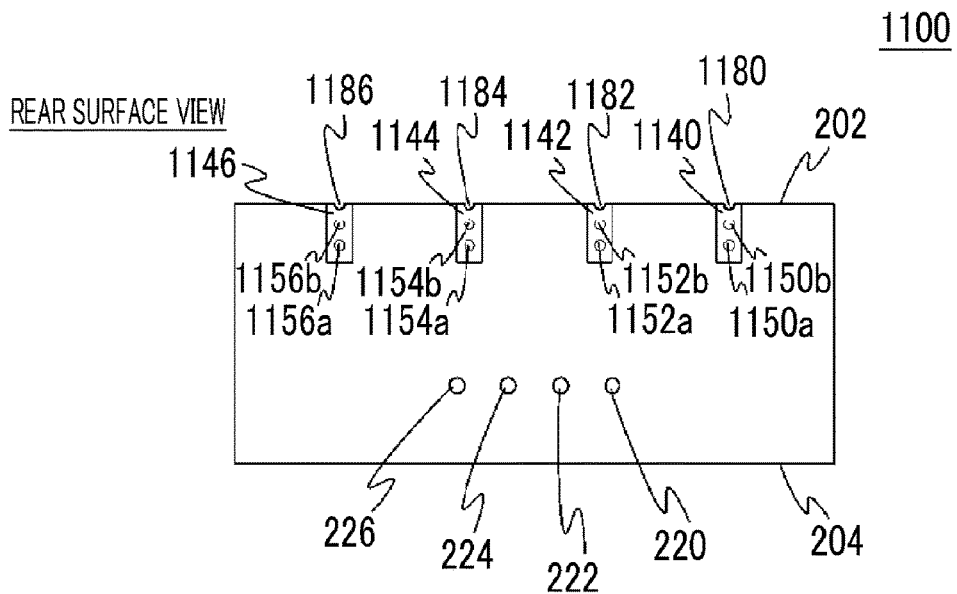
FIG. 11C is a view illustrating a rear surface of the third modification example of FPC used in the optical modulator illustrated in FIG. 1A, FIG. 1B, and FIG. 1C.

FIG. 11A, FIG. 11B, and FIG. 11C are views illustrating the constitution of FPC 1100 according to the present modification example which can be used instead of FPC 106. Meanwhile, in FIG. 11A, FIG. 11B, and FIG. 11C, the same constituent elements as those of FPC 106 illustrated in FIG. 2A, FIG. 2B, and FIG. 2C will be represented by the same reference sign in FIG. 2A, FIG. 2B, and FIG. 2C, and the above description regarding FIG. 2A, FIG. 2B, and FIG. 2C will be incorporated.

Figure 12:
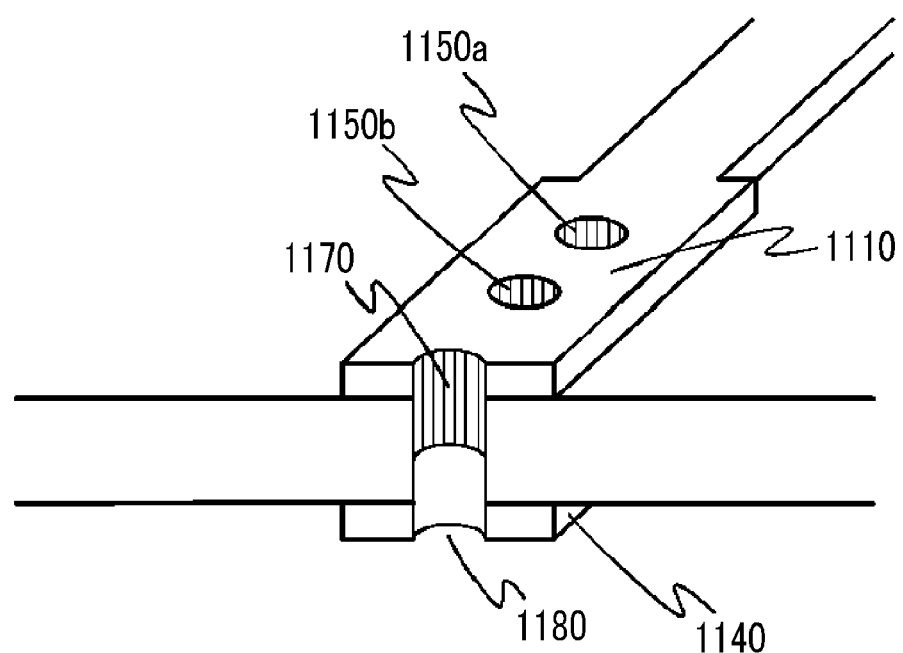
FIG. 12 is a perspective view illustrating detail of an E portion of FPC illustrated in FIG. 11A, FIG. 11B, and FIG. 11C.

FIG. 11A is a view illustrating the constitution of one surface (referred to as the front surface) of FPC 1100, FIG. 11B is a side surface view of FPC 1100 along the side 202 illustrated in FIG. 11A, and FIG. 11C is a view illustrating the constitution of the other surface (referred to as the rear surface) of FPC 1100. In addition, FIG. 12 is a perspective view illustrating detail of an E portion illustrated in FIG. 11A.

FPC 1100 illustrated in FIG. 11A, FIG. 11B, and FIG. 11C has the same constitution as FPC 106 illustrated in FIG. 2A, FIG. 2B, and FIG. 2C; however, on the front surface, pads 1110, 1112, 1114, and 1116 are provided instead of the pads 210, 212, 214, and 216. In addition, on the rear surface, pads 1140, 1142, 1144, and 1146 are provided instead of the pads 240, 242, 244, and 246.

In addition, the pads 1110, 1112, 1114, and 1116 on the front surface of FPC 1100 and the respectively corresponding pads 1140, 1142, 1144, and 1146 on the rear surface of FPC 1100 are connected to each other through two through-holes 1150a and 1150b, through-holes 1152a and 1152b, through-holes 1154a and 1154b, and through-holes 1156a and 1156b respectively.

Here, the through-holes 1150a and 1150b, the through-holes 1152a and 1152b, the through-holes 1154a and 1154b, and the through-holes 1156a and 1156b respectively have metallized inner surfaces and/or are filled with conductive materials such as solder, and thus the pads 1110, 1112, 1114, and 1116 on the front surface of FPC 1100 are thermally connected to the respectively corresponding pads 1140, 1142, 1144, and 1146 on the rear surface of FPC 1100 through these through-holes.

In addition, in FPC 1100, four recess portions 1180, 1182, 1184, and 1186 having a semi-circular shape in a plan view (seen from, for example, the front surface) are provided at locations that respectively correspond to the pads 1110, 1112, 1114, and 1116 on the side surface along the side 202. In addition, metal films 1170, 1172, 1174, and 1176 connected to the pads 1110, 1112, 1114, and 1116 on the front surface are respectively provided in some of the inner surfaces of the recess portions 1180, 1182, 1184, and 1186. FIG. 12 illustrates, as an example, the metal film 1170 (the hatched portion in the drawing) connected to the pad 1110 on the front surface which is provided in some of the inner surface of the recess portion 1180.

Therefore, in FPC 1100, similar to FPC 900 according to the second modification example illustrated in FIG. 9A, FIG. 9B, and FIG. 9C, solder leaking from the pads gathers in the portions of the metal films 1170, 1172, 1174, and 1176 in the recess portions 1180, 1182, 1184, and 1186 due to the capillary phenomenon, form meniscus curved surfaces in a state of being joined to these metal films, and solidify, and thus stable radio frequency propagation characteristics can be obtained by decreasing the variation in the shapes of the solder connection portions.

Meanwhile, the metal films 1170, 1172, 1174, and 1176 on the inner surfaces of the recess portions 1180, 1182, 1184, and 1186 can be produced by applying, for example, burrs of metal into the inside of through-holes in the case of producing the through-holes by punching patterns of the metal provided on FPC using a circular mold. For example, the side 202 may be formed by forming four long rectangular metal patterns which will becomes the pads 1110, 1112, 1114, and 1116 on a large-sized FPC in parallel, forming through-holes in the respective metal patterns one by one by means of punching using a circular mold so that the through-holes form one row as a whole (in some of the inner surfaces of the respective through-holes, as described above, metal films connected to the metal patterns are formed using burrs of metal of the metal patterns), and cutting the large-sized FPC along a line that runs through the center of the respective formed through-holes.

Meanwhile, regarding the through-holes 1150a, 1150b, 1150c, 1152a, 1152b, 1152c, 1154a, 1154b, 1154c, 1156a, 1156b, and 1156c, instead of providing metal films on the entire surface of the inner surfaces, similar to the above, it is possible to provide metal films that will be connected to the corresponding pads 1110, 1112, 1114, and 1116 in some of the inner surfaces by means of punching using a circular mold. In this case as well, the thermal conducting property from the pads 1140, 1142, 1144, and 1146 on the rear surface of FPC 1100 toward the pads 1110, 1112, 1114, and 1116 on the front surface enhances, and thus it is possible to decrease the variations in the solder shapes and the connection quality of the connection portions between the pads 1110, 1112, 1114, and 1116 on the front surface and the pads 410, 412, 414, and 416 on the circuit substrate 400 using a soldering iron or the like pressed onto the rear surface.

In addition, in the present modification example, the metal films 1170, 1172, 1174, and 1176 connected to the pads 1110, 1112, 1114, and 1116 on the front surface are respectively provided in some of the inner surfaces of the recess portions 1180, 1182, 1184, and 1186, but the constitution is not limited thereto, and furthermore, metal films connected to the pads 1140, 1142, 1144, and 1146 on the rear surface may be respectively provided in some of regions not provided with the metal films 1170, 1172, 1174, and 1176 out of the inner surfaces of the recess portions 1180, 1182, 1184, and 1186. In this case, due to the metal films provided on the inner surfaces of the recess portions 1180, 1182, 1184, and 1186, more effectively, solder leaking from the pad 1110 and the like gathers in the recess portion 1180 and the like due to the capillary phenomenon and solidify, and thus stable radio frequency propagation characteristics can be obtained by decreasing the variation in the shapes of the solder connection portions.

Fourth Modification Example

Next, a fourth modification example of FPC 106 that is used in the optical modulator 100 illustrated in FIG. 1A, FIG. 1B, and FIG. 1C will be described.

In FPC 106 illustrated in FIG. 2A, FIG. 2B, FIG. 2C, and FIG. 3, the pad 210 and the like on the front surface and the pad 240 and the like on the rear surface are connected to each other through the metal film 270 and the like provided on the flat side surface along the side 202, and heat from the pad 240 and the like heated using, for example, a soldering iron is transmitted to the pad 210 and the like through the metal film 270 and the like, whereby the pad 210 and the like and the pad 410 and the like on the circuit substrate 400 are solder-connected to each other.

In contrast, in the present modification example, recess portions which are as wide as the corresponding pads and have a rectangular shape in a plan view (seen from, for example, the front surface) are provided in a side surface portion of FPC which is provided with metal films connecting pads on the front surface and the rear surface, and the metal films are formed on the entire bottom surfaces of the recess portions.

Figure 13A:
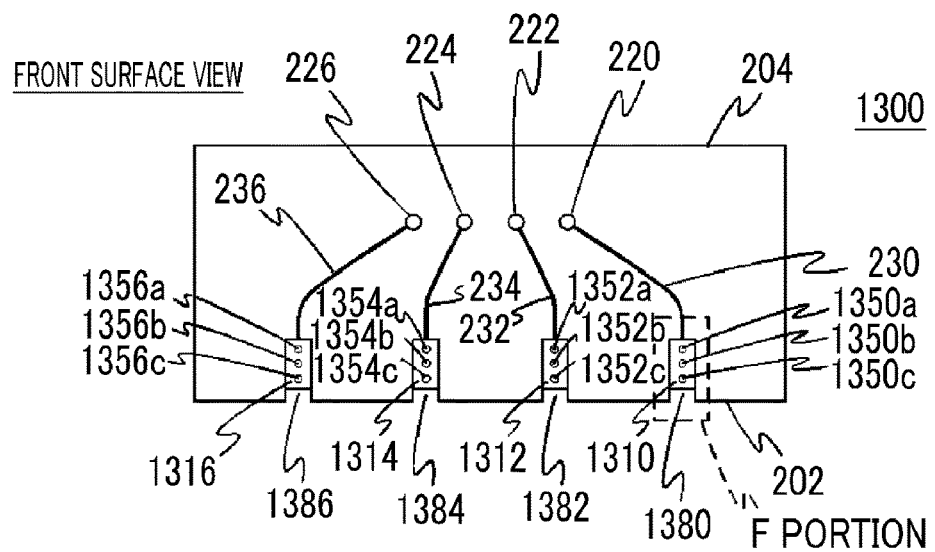
FIG. 13A is a view illustrating a front surface of a fourth modification example of FPC used in the optical modulator illustrated in FIG. 1A, FIG. 1B, and FIG. 1C.
Figure 13B:
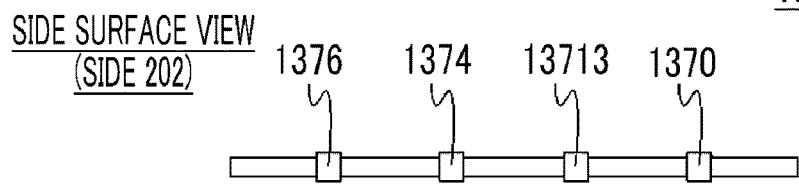
FIG. 13B is a view illustrating a side surface of the fourth modification example of FPC used in the optical modulator illustrated in FIG. 1A, FIG. 1B, and FIG. 1C.
Figure 13C:
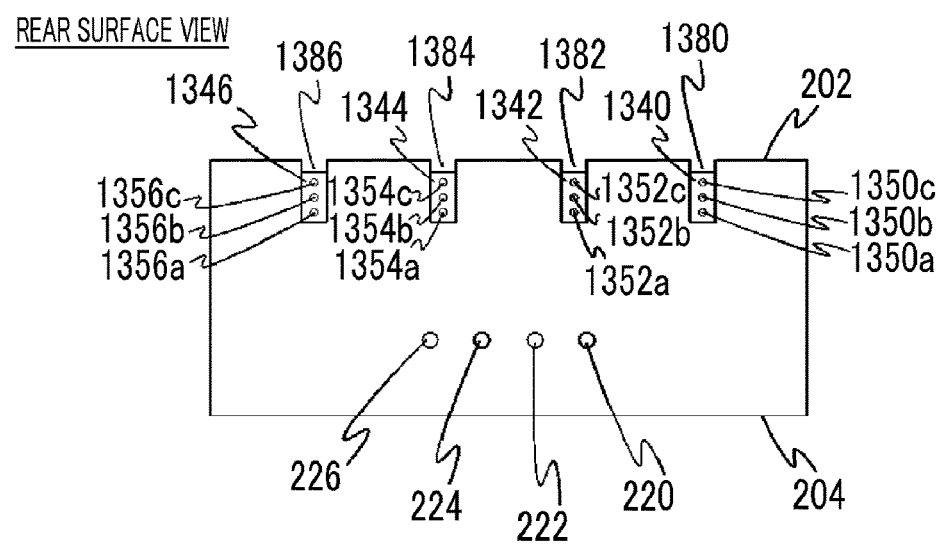
FIG. 13C is a view illustrating a rear surface of the fourth modification example of FPC used in the optical modulator illustrated in FIG. 1A, FIG. 1B, and FIG. 1C.

FIG. 13A, FIG. 13B, and FIG. 13C are views illustrating the constitution of FPC 1300 according to the present modification example which can be used instead of FPC 106. Meanwhile, in FIG. 13A, FIG. 13B, and FIG. 13C, the same constituent elements as those of FPC 106 illustrated in FIG. 2A, FIG. 2B, and FIG. 2C will be represented by the same reference sign in FIG. 2A, FIG. 2B, and FIG. 2C, and the above description regarding FIG. 2A, FIG. 2B, and FIG. 2C will be incorporated.

Figure 14:
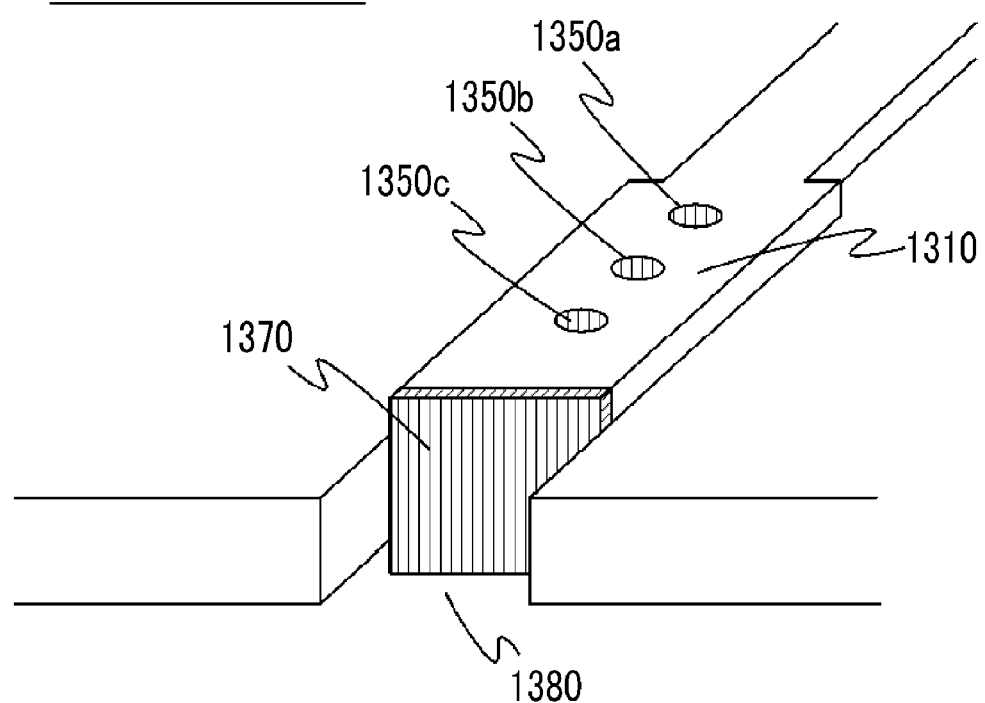
FIG. 14 is a perspective view illustrating detail of an F portion of FPC illustrated in FIG. 13A, FIG. 13B, and FIG. 13C.

FIG. 13A is a view illustrating the constitution of one surface (referred to as the front surface) of FPC 1300, FIG. 13B is a side surface view of FPC 1300 along the side 202 illustrated in FIG. 13A, and FIG. 13C is a view illustrating the constitution of the other surface (referred to as the rear surface) of FPC 1300. In addition, FIG. 14 is a perspective view illustrating detail of an F portion illustrated in FIG. 13A.

FPC 1300 illustrated in FIG. 13A, FIG. 13B, and FIG. 13C has the same constitution as FPC 106 illustrated in FIG. 2A, FIG. 2B, and FIG. 2C; however, on the front surface, pads 1310, 1312, 1314, and 1316 are provided instead of the pads 210, 212, 214, and 216. In addition, on the rear surface, pads 1340, 1342, 1344, and 1346 are provided instead of the pads 240, 242, 244, and 246.

In addition, the pads 1310, 1312, 1314, and 1316 on the front surface of FPC 1300 and the respectively corresponding pads 1340, 1342, 1344, and 1346 on the rear surface of FPC 1300 are connected to each other through three through-holes 1350a, 1350b, and 1350c, through-holes 1352a, 1352b, and 1352c, through-holes 1354a, 1354b, and 1354c, and through-holes 1356a, 1356b, and 1356c respectively.

Here, the through-holes 1350a, 1350b, and 1350c, the through-holes 1352a, 1352b, and 1352c, the through-holes 1354a, 1354b, and 1354c, and the through-holes 1356a, 1356b, and 1356c respectively have metallized inner surfaces and/or are filled with conductive materials such as solder, and thus the pads 1310, 1312, 1314, and 1316 on the front surface of FPC 1300 are thermally connected to the respectively corresponding pads 1340, 1342, 1344, and 1346 on the rear surface of FPC 1300 through these through-holes.

In addition, in FPC 1300, metal films 1370, 1372, 1374, and 1376 are provided at locations that respectively correspond to the pads 1310, 1312, 1314, and 1316 on the side surface (or the end surface) along the side 202, and the pads 1310, 1312, 1314, and 1316 on the front surface are respectively thermally connected to the pads 1340, 1342, 1344, and 1346 on the rear surface through these metal films.

Particularly, in FPC 1300 according to the present modification example, four recess portions 1380, 1382, 1384, and 1386 which are as wide as the corresponding pads 1310, 1312, 1314, and 1316 and have a rectangular shape in a plan view (seen from, for example, the front surface) are provided in the respective portions provided with metal films 1370, 1372, 1374, and 1376 on the side surface of FPC 1300 along the side 202. That is, the metal films 1370, 1372, 1374, and 1376 are provided on the entire regions of the bottom surfaces (that is, the surface parallel to the side 202) of the recess portions 1380, 1382, 1384, and 1386. FIG. 14 illustrates, as an example, the metal film 1370 (the hatched portion in the drawing) that connects the pad 1310 on the front surface and the pad 1340 on the rear surface which are provided on the bottom surface of the recess portion 1380.

Therefore, in the present modification example, even in a case in which the width of the pads 410, 412, 414, and 416 on the circuit substrate 400 is wider than the width of the pads 1310, 1312, 1314, and 1316 on FPC 1300, a majority of solder leaking from the end portions on the side 202 side of the pads 1310, 1312, 1314, and 1316 remains in the recess portions 1380, 1382, 1384, and 1386, comes into contact with the metal films 1370, 1372, 1374, and 1376, and form smooth meniscus curved surfaces, and thus the variations in the solder shapes and radio frequency propagation characteristics in the connect ion portions between the pad 410 and the like on the circuit substrate 400 and the pads 1310 and the like on FPC 1300 are suppressed.

Fifth Modification Example

Next, a fifth modification example of FPC 106 that is used in the optical modulator 100 illustrated in FIG. 1A, FIG. 1B, and FIG. 1C will be described.

In FPC 1300 according to the fourth modification example illustrated in FIG. 13A, FIG. 13B, and FIG. 13C, rectangular recess portions which are as wide as the corresponding pads are provided on the side surface portion of FPC provided with metal films connecting pads on the front surface and the rear surface, and metal films are formed on the entire bottom surfaces of the recess portions.

In contrast, in the present modification example, similar to FPC 1300 according to the fourth modification example, recess portions having a rectangular shape in a plan view are formed in the side surface portion of FPC provided with metal films connecting pads on the front surface and the rear surface, but the recess portions have a width wider than the width of the corresponding pads, and the metal films are formed in some of the bottom surfaces of the recess portions.

Figure 15A:
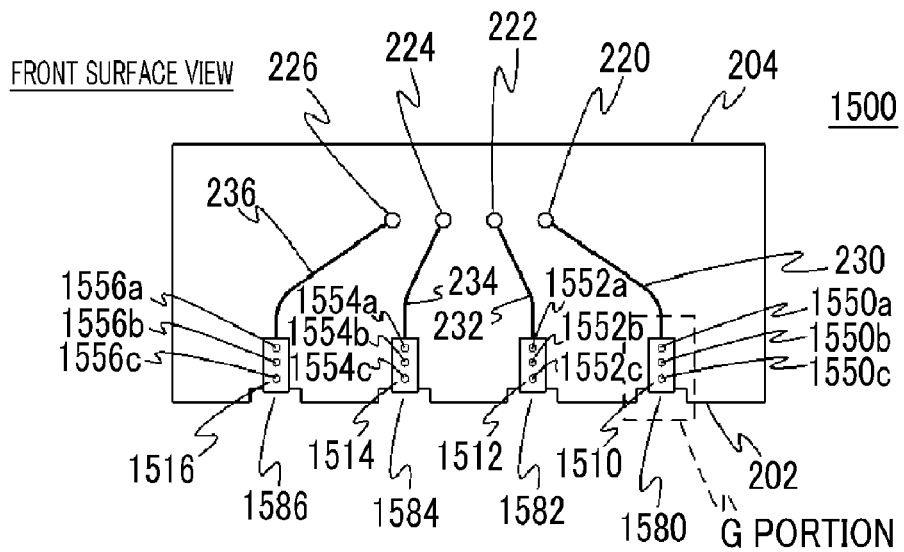
FIG. 15A is a view illustrating a front surface of a fifth modification example of FPC used in the optical modulator illustrated in FIG. 1A, FIG. 1B, and FIG. 1C.
Figure 15B:
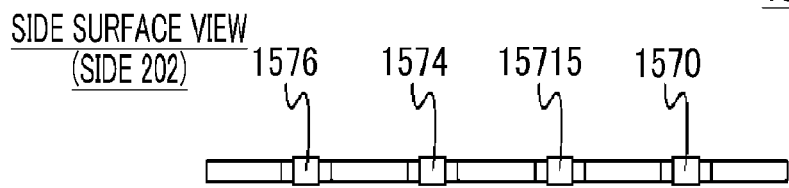
FIG. 15B is a view illustrating a side surface of the fifth modification example of FPC used in the optical modulator illustrated in FIG. 1A, FIG. 1B, and FIG. 1C.
Figure 15C:
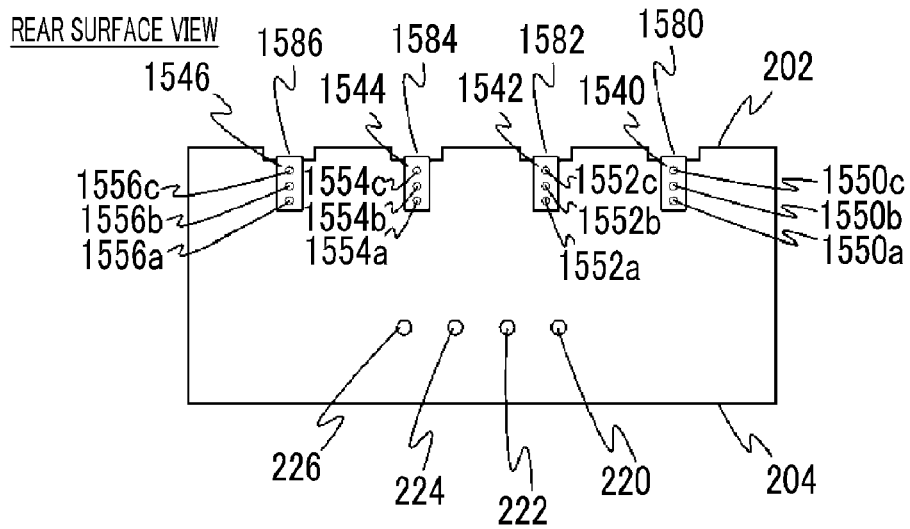
FIG. 15C is a view illustrating a rear surface of the fifth modification example of FPC used in the optical modulator illustrated in FIG. 1A, FIG. 1B, and FIG. 1C.

FIG. 15A, FIG. 15B, and FIG. 15C are views illustrating the constitution of FPC 1500 according to the present modification example which can be used instead of FPC 106. Meanwhile, in FIG. 15A, FIG. 15B, and FIG. 15C, the same constituent elements as those of FPC 106 illustrated in FIG. 2A, FIG. 2B, and FIG. 2C will be represented by the same reference sign in FIG. 2A, FIG. 2B, and FIG. 2C, and the above description regarding FIG. 2A, FIG. 2B, and FIG. 2C will be incorporated.

Figure 16:
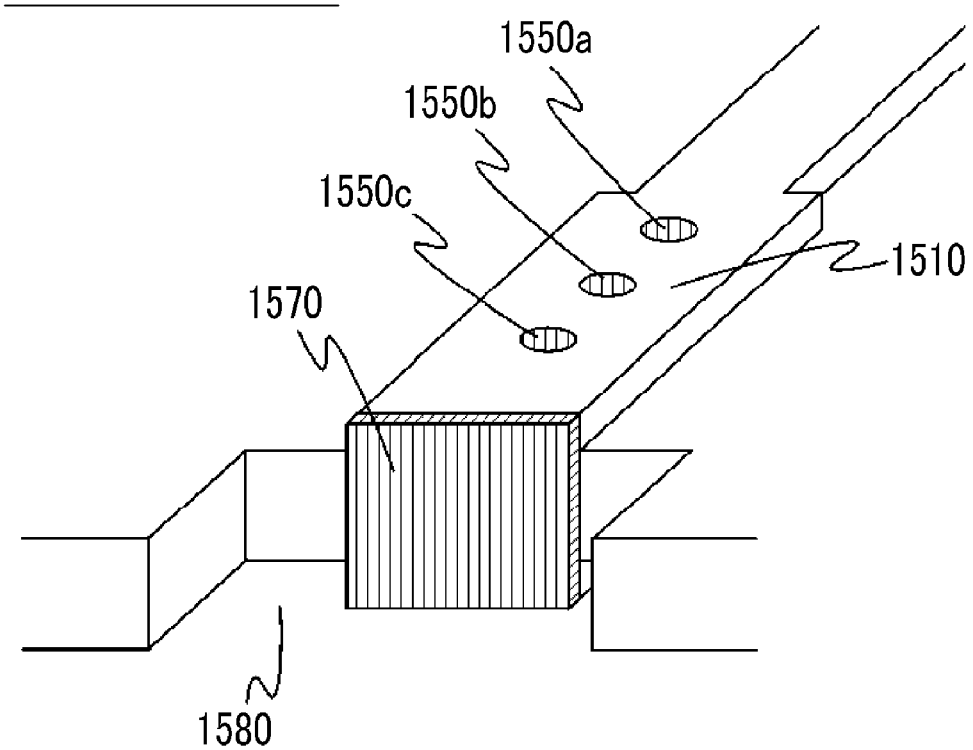
FIG. 16 is a perspective view illustrating detail of a G portion of FPC illustrated in FIG. 15A, FIG. 15B, and FIG. 15C.

FIG. 15A is a view illustrating the constitution of one surface (referred to as the front surface) of FPC 1500, FIG. 15B is a side surface view of FPC 1500 along the side 202 illustrated in FIG. 15A, and FIG. 15C is a view illustrating the constitution of the other surface (referred to as the rear surface) of FPC 1500. In addition, FIG. 16 is a perspective view illustrating detail of the G portion illustrated in FIG. 15A.

FPC 1500 illustrated in FIG. 15A, FIG. 15B, and FIG. 15C has the same constitution as FPC 106 illustrated in FIG. 2A, FIG. 2B, and FIG. 2C; however, on the front surface, pads 1510, 1512, 1514, and 1516 are provided instead of the pads 210, 212, 214, and 216. In addition, on the rear surface, pads 1540, 1542, 1544, and 1546 are provided instead of the pads 240, 242, 244, and 246.

In addition, the pads 1510, 1512, 1514, and 1516 on the front surface of FPC 1500 and the respectively corresponding pads 1540, 1542, 1544, and 1546 on the rear surface of FPC 1500 are connected to each other through three through-holes 1550a, 1550b, and 1550c, through-holes 1552a, 1552b, and 1552c, through-holes 1554a, 1554b, and 1554c, and through-holes 1556a, 1556b, and 1556c respectively.

Here, the through-holes 1550a, 1550b, and 1550c, the through-holes 1552a, 1552b, and 1552c, the through-holes 1554a, 1554b, and 1554c, and the through-holes 1556a, 1556b, and 1556c respectively have metallized inner surfaces and/or are filled with conductive materials such as solder, and thus the pads 1510, 1512, 1514, and 1516 on the front surface of FPC 1500 are thermally connected to the respectively corresponding pads 1540, 1542, 1544, and 1546 on the rear surface of FPC 1500 through these through-holes.

In addition, in FPC 1500, metal films 1570, 1572, 1574, and 1576 are provided at locations that respectively correspond to the pads 1510, 1512, 1514, and 1516 on the side surface along the side 202, and the pads 1510, 1512, 1514, and 1516 on the front surface are respectively thermally connected to the pads 1540, 1542, 1544, and 1546 on the rear surface through these metal films.

Particularly, in FPC 1500 according to the present modification example, four recess portions 1580, 1582, 1584, and 1586 which are wider than the corresponding pads 1510, 1512, 1514, and 1516 and have a rectangular shape in a plan view (seen from, for example, the front surface) are provided in the respective portions provided with metal films 1570, 1572, 1574, and 1576 on the side surface of FPC 1500 along the side 202. FIG. 16 illustrates, as an example, the metal film 1570 (the hatched portion in the drawing) that connects the pad 1510 on the front surface and the pad 1540 on the rear surface which are provided on some of the bottom surfaces of the recess portion 1580.

Due to the present constitution, in the present modification example, since the recess portions 1580 and the like are formed so as to have a width wider than the widths of the pads 1510 and the like, it is easy to visually confirm the corresponding pads 410 and the like formed on the circuit substrate 400 from the above, and thus, even in a case in which the widths of the pads 410 and the like on the circuit substrate 400 are extremely small, it is possible to decrease assembly variations such as location misalignment between the pads 410 and the like and the pads 1510 and the like. In addition, even in a case in which the amount of solder is increased in order to increase the connection strength or thermal conduction of pad portions, due to the recess portions 1580 and the like being formed so as to have a wide width, excess solder can be further solidified on the side surface of the recess portions 1580 and the like, and thus it is possible to increase the permissible amount of excess solder. As a result, it is possible to obtain effects such as the stabilization of the makeup quality and connection shape of the solder connection portions and the possibility of further stabilizing the variation in radio frequency characteristics.

Sixth Modification Example

Next, a sixth modification example of FPC 106 that is used in the optical modulator 100 illustrated in FIG. 1A, FIG. 1B, and FIG. 1C will be described.

In FPC 1300 according to the fourth modification example illustrated in FIG. 13A, FIG. 13B, and FIG. 13C, rectangular recess portions which are as wide as the corresponding pads and have a rectangular shape are provided on the side surface portion of FPC provided with metal films connecting pads on the front surface and the rear surface, and metal films are formed on the entire bottom surfaces of the recess portions.

In contrast, in the present modification example, similar to FPC 1300 according to the fourth modification example, recess portions having a rectangular shape in a plan view are formed in the side surface portion of FPC provided with metal films connecting pads on the front surface and the rear surface, but the recess portions have a width narrower than the width of the corresponding pads, and the metal films are formed in the entire inner surfaces of the recess portions.

Figure 17A:
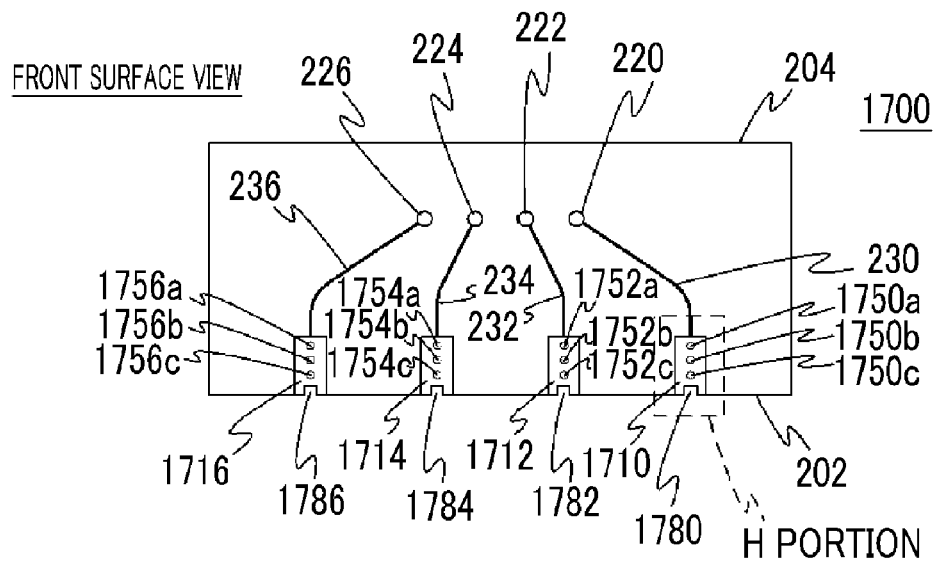
FIG. 17A is a view illustrating a front surface of a sixth modification example of FPC used in the optical modulator illustrated in FIG. 1A, FIG. 1B, and FIG. 1C.
Figure 17B:
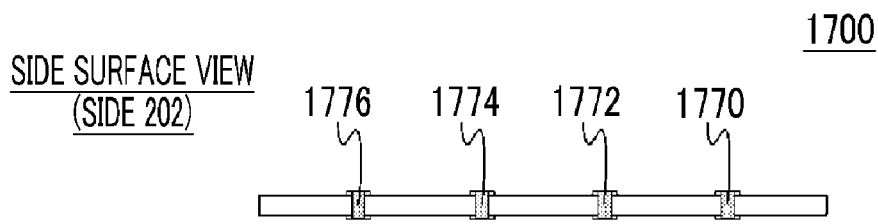
FIG. 17B is a view illustrating a side surface of the sixth modification example of FPC used in the optical modulator illustrated in FIG. 1A, FIG. 1B, and FIG. 1C.
Figure 17C:
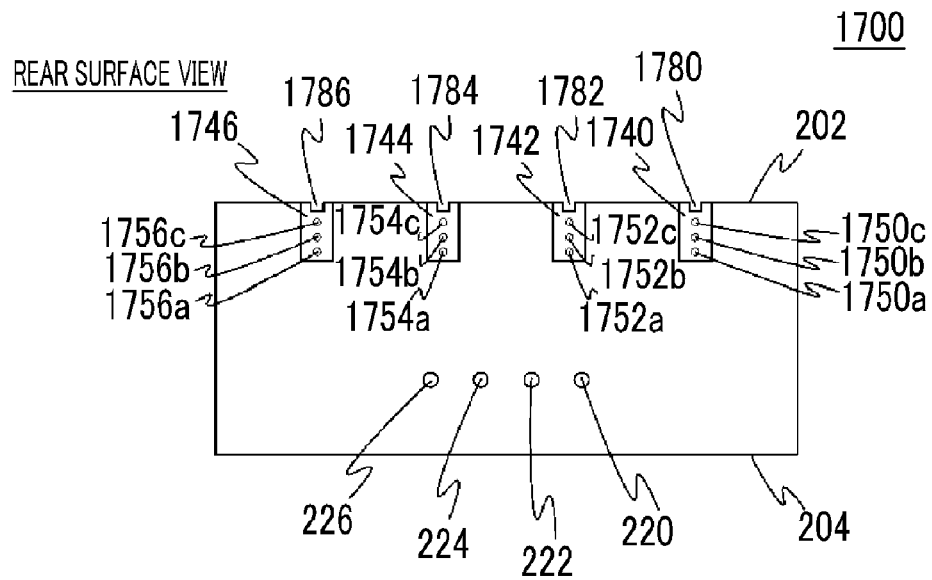
FIG. 17C is a view illustrating a rear surface of the sixth modification example of FPC used in the optical modulator illustrated in FIG. 1A, FIG. 1B, and FIG. 1C.

FIG. 17A, FIG. 17B, and FIG. 17C are views illustrating the constitution of FPC 1700 according to the present modification example which can be used instead of FPC 106. Meanwhile, in FIG. 17A, FIG. 17B, and FIG. 17C, the same constituent elements as those of FPC 106 illustrated in FIG. 2A, FIG. 2B, and FIG. 2C will be represented by the same reference sign in FIG. 2A, FIG. 2B, and FIG. 2C, and the above description regarding FIG. 2A, FIG. 2B, and FIG. 2C will be incorporated.

Figure 18:
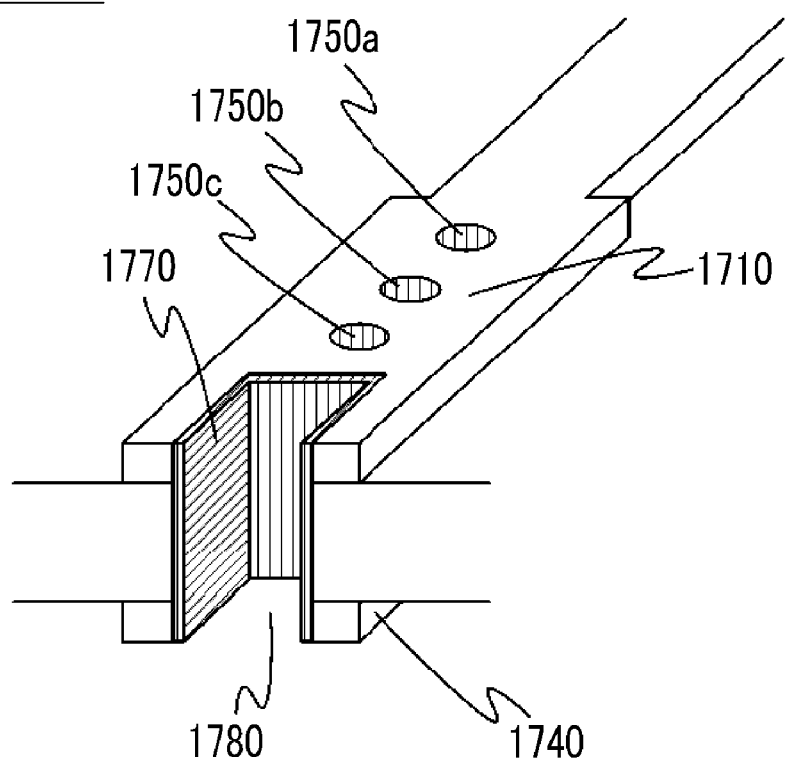
FIG. 18 is a perspective view illustrating detail of an H portion of FPC illustrated in FIG. 17A, FIG. 17B, and FIG. 17C.

FIG. 17A is a view illustrating the constitution of one surface (referred to as the front surface) of FPC 1700, FIG. 17B is a side surface view of FPC 1700 along the side 202 illustrated in FIG. 17A, and FIG. 17C is a view illustrating the constitution of the other surface (referred to as the rear surface) of FPC 1700. In addition, FIG. 18 is a perspective view illustrating detail of the H portion illustrated in FIG. 17A.

FPC 1700 illustrated in FIG. 17A, FIG. 17B, and FIG. 17C has the same constitution as FPC 106 illustrated in FIG. 2A, FIG. 2B, and FIG. 2C; however, on the front surface, pads 1710, 1712, 1714, and 1716 are provided instead of the pads 210, 212, 214, and 216. In addition, on the rear surface, pads 1740, 1742, 1744, and 1746 are provided instead of the pads 240, 242, 244, and 246.

In addition, the pads 1710, 1712, 1714, and 1716 on the front surface of FPC 1700 and the respectively corresponding pads 1740, 1742, 1744, and 1746 on the rear surface of FPC 1700 are connected to each other through three through-holes 1750a, 1750b, and 1750c, through-holes 1752a, 1752b, and 1752c, through-holes 1754a, 1754b, and 1754c, and through-holes 1756a, 1756b, and 1756c respectively.

Here, the through-holes 1750a, 1750b, and 1750c, the through-holes 1752a, 1752b, and 1752c, the through-holes 1754a, 1754b, and 1754c, and the through-holes 1756a, 1756b, and 1756c respectively have metallized inner surfaces and/or are filled with conductive materials such as solder, and thus the pads 1710, 1712, 1714, and 1716 on the front surface of FPC 1700 are thermally connected to the respectively corresponding pads 1740, 1742, 1744, and 1746 on the rear surface of FPC 1700 through these through-holes.

In addition, in FPC 1700, metal films 1770, 1772, 1774, and 1776 are provided at locations that respectively correspond to the pads 1710, 1712, 1714, and 1716 on the side surface along the side 202, and the pads 1710, 1712, 1714, and 1716 on the front surface are respectively thermally connected to the pads 1740, 1742, 1744, and 1746 on the rear surface through these metal films.

Particularly, in FPC 1700 according to the present modification example, four recess portions 1780, 1782, 1784, and 1786 which are narrower than the corresponding pads 1710, 1712, 1714, and 1716 and have a rectangular shape in a plan view (seen from, for example, the front surface) are provided in the respective portions provided with metal films 1770, 1772, 1774, and 1776 on the side surface of FPC 1700 along the side 202. Therefore, in the present modification example, similar to FPC 700 according to the first modification example illustrated in FIG. 7A, FIG. 7B, and FIG. 7C, solder leaking from the side 202 side end portions of the pads 1710, 1712, 1714, and 1716 enters the recess portions 1780, 1782, 1784, and 1786 due to the capillary phenomenon, and thus it is possible to effectively prevent the leaked solder from flowing into the pads 410, 412, 414, and 416 on the circuit substrate 400. As a result, in the present modification example, compared with FPC 106, the variation in the solder shapes (shapes after solidification) in the connection portions between the pads 1710, 1712, 1714, and 1716 and the pads 410, 412, 414, and 416 on the circuit substrate 400 decreases, and stable radio frequency propagation characteristics can be obtained.

Meanwhile, in the present modification example, the metal films 1770, 1772, 1774, and 1776 are respectively provided in the entire regions of the three inner surfaces of the respective recess portions 1780, 1782, 1784, and 1786, but the constitution is not limited thereto, and the metal films 1770 and the like connecting the pads 1710 and the like on the front surface and the pads 1740 and the like on the rear surface may be provided in at least some of at least one of the three inner surfaces.

Second Embodiment

Next, a second embodiment of the present invention will be described. The present embodiment is an optical transmission device equipped with the optical modulator 100 described in the first embodiment (including the optical modulators including FPC according to an arbitrary modification example illustrated in FIG. 7A, FIG. 7B, FIG. 7C, FIG. 8, FIG. 9A, FIG. 9B, FIG. 9C, FIG. 10, FIG. 11A, FIG. 11B, FIG. 11C, FIG. 12, FIG. 13A, FIG. 13B, FIG. 13C, FIG. 14, FIG. 15A, FIG. 15B, FIG. 15C, FIG. 16, FIG. 17A, FIG. 17B, FIG. 17C, and FIG. 18).

Figure 19:
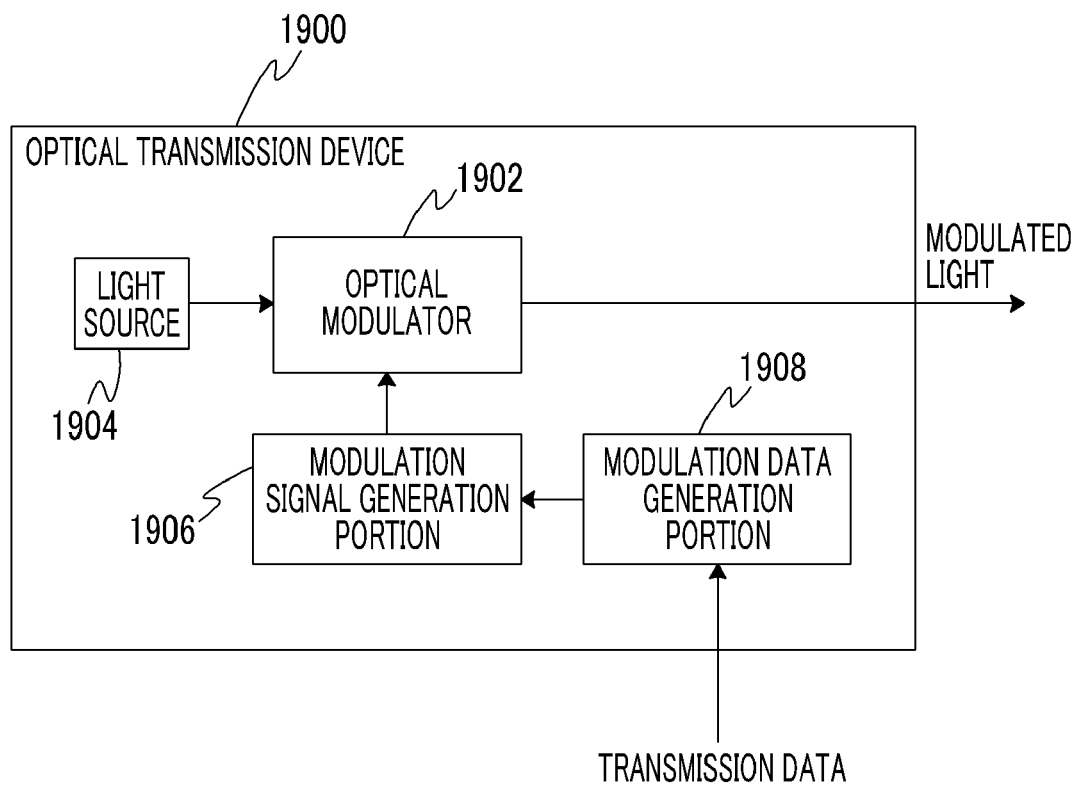
FIG. 19 is a view illustrating a constitution of an optical transmission device according to a second embodiment of the present invention.
Figure 20A:
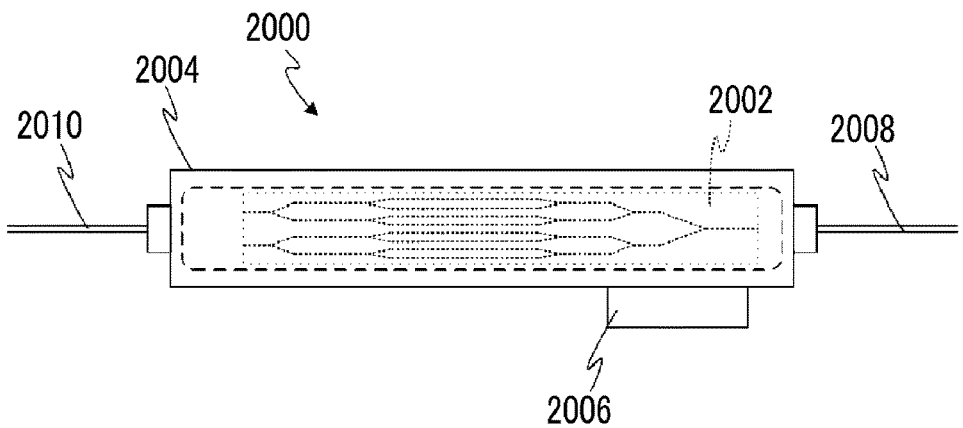
FIG. 20A is a top view of an example of an optical modulator of the related art.
Figure 20B:
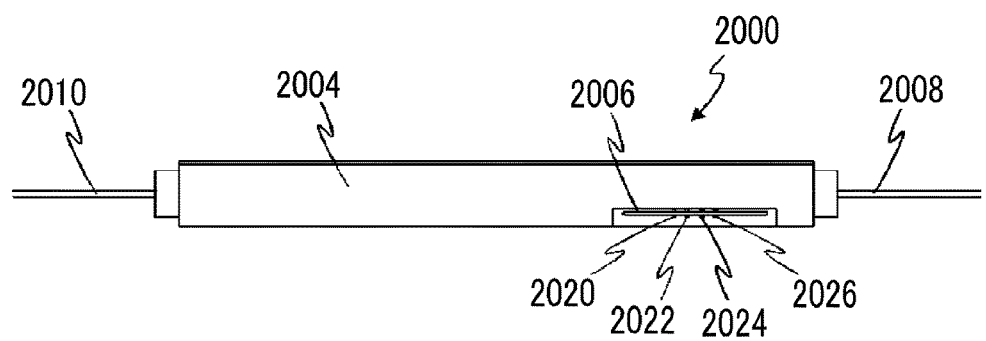
FIG. 20B is a side view of the example of the optical modulator of the related art.
Figure 20C:
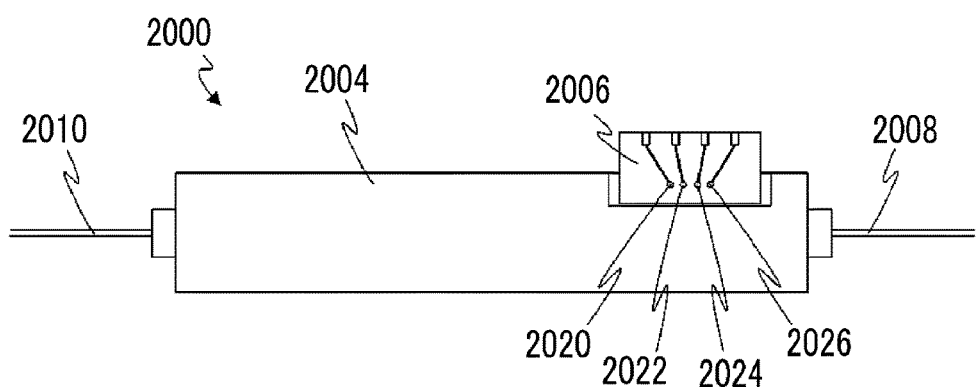
FIG. 20C is a bottom view of the example of the optical modulator of the related art.
Figure 21:
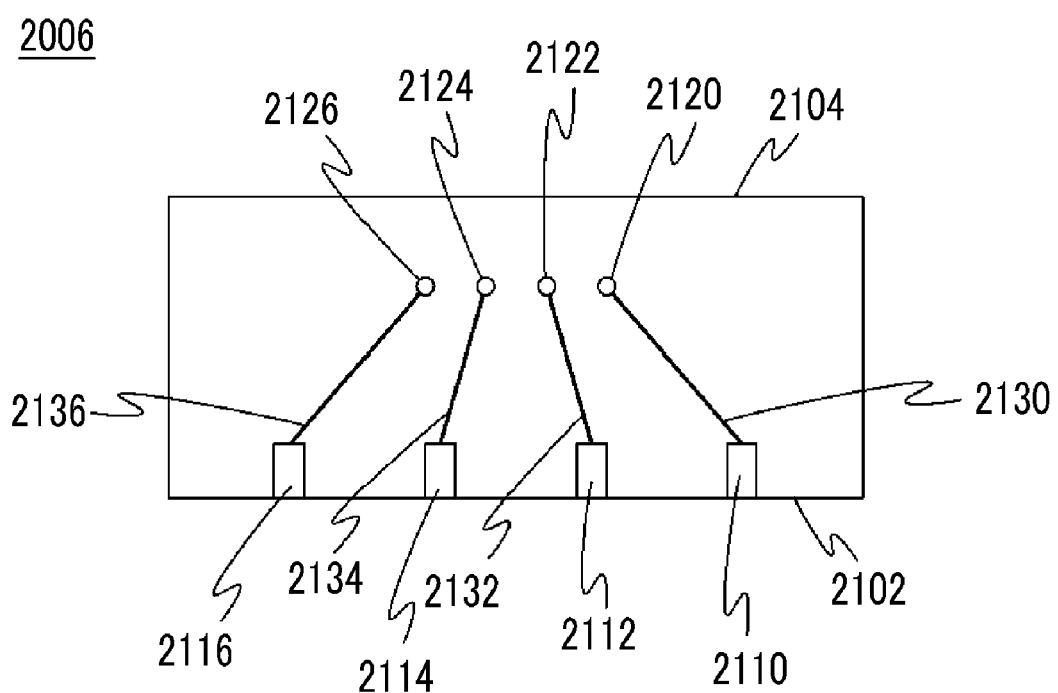
FIG. 21 is a view illustrating an example of a constitution of FPC used in the optical modulator of the related art illustrated in FIG. 20A, FIG. 203, and FIG. 20C.
Figure 22A:
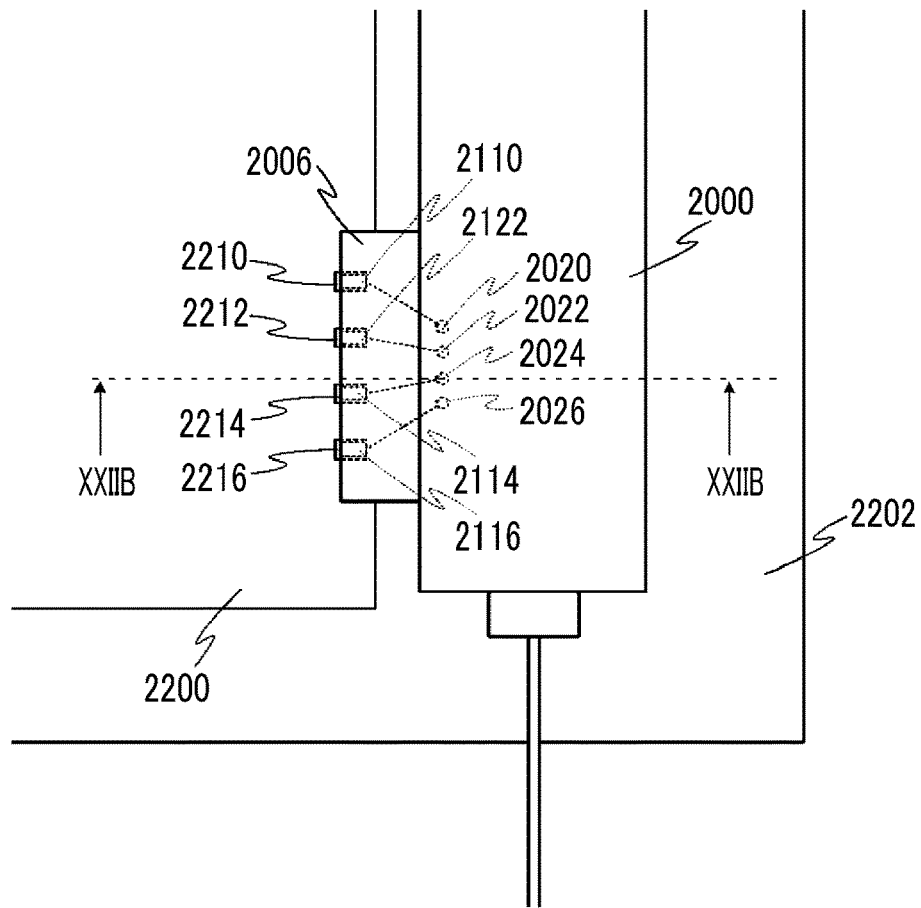
FIG. 22A is a view illustrating an example of a state of the optical modulator of the related art illustrated in FIG. 20A, FIG. 20B, and FIG. 20C connected to a circuit substrate on which an electronic circuit is constituted.
Figure 22B:
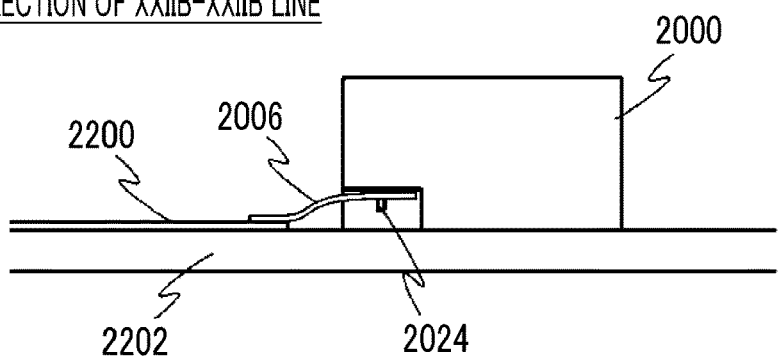
FIG. 22B is a cross-sectional view in a direction of a XXIIB-XXIIB line of the optical modulator and the circuit substrate illustrated in FIG. 22A.

FIG. 19 is a view illustrating the constitution of the optical transmission device according to the present embodiment. The present optical transmission device 1900 has an optical modulator 1902, a light source 1904 making light incident on the optical modulator 1902, and a modulation signal generation portion 1906, and a modulation data generation portion 1908.

The optical modulator 1902 is the optical modulator 100 illustrated in FIG. 1A, FIG. 1B, and FIG. 1C (which may include any of FPC 700, 900, 1100, 1300, or 1700 illustrated in FIG. 7A, FIG. 7B, FIG. 7C, FIG. 8, FIG. 9A, FIG. 9B, FIG. 9C, FIG. 10, FIG. 11A, FIG. 11B, FIG. 11C, FIG. 12, FIG. 13A, FIG. 13B, FIG. 13C, FIG. 14, FIG. 15A, FIG. 15B, FIG. 15C, FIG. 16, FIG. 17A, FIG. 17B, FIG. 17C, and FIG. 18 instead of FPC 106). The modulation data generation portion 1908 generates modulation data for receiving transmission data supplied from the outside and transmitting the transmission data (for example, data obtained by converting or processing transmission data to a predetermined data format) and outputs the generated modulation data to the modulation signal generation portion 1906.

The modulation signal generation portion 1906 is an electronic circuit that outputs electric signals for causing modulation operation in the optical modulator 1902, generates modulation signals which are radio frequency signals for causing optical modulation operations according to the modulation data in the optical modulator 1902 on the basis of the modulation data output by the modulation data generation portion 1908, and inputs the modulation signals to the optical modulator 100. The modulation signals are made up of four RF signals corresponding to four RF electrodes (not illustrated) in the optical modulation element 102 in the optical modulator 100.

The four RF signals are respectively input to the pads 210, 212, 214, and 216 on FPC 106 (which may be, as described above, any FPC of the modification examples described above regarding FPC 106) in the optical modulator 100 and are respectively applied to the RF electrodes through the wire patterns 230, 232, 234, and 236, the through-holes for signals 220, 222, 224, and 226, and the lead pins for signals 120, 122, 124, and 126.

Therefore, light output from the light source 1904 is modulated by the optical modulator 100, turns into modulated light, and is output from the optical transmission device 1900.

Particularly, in the present optical transmission device 1900, since the optical modulator 100 having the above-described constitution is used, in the case of combining the optical modulator 100 into the optical transmission device 1900, it is possible to ensure favorable optical transmission qualities by effectively suppressing the variations in the solder connection shapes and radio frequency propagation characteristics of the connection portions between the pads 210 and the like formed on FPC 106 in the optical modulator 100 and the corresponding pads on the circuit substrate (not illustrated) in the optical transmission device 1900.

Meanwhile, in the respective embodiments described above, the optical modulators including the optical modulation element which has the substrate made of LN and four RF electrodes have been described, but the present invention is not limited thereto and can be applied in the same manner to optical modulators having more or less RF electrodes and optical modulators in which materials other than LN are used for substrates. In addition, the constitution of FPC 106 illustrated in FIG. 2A, FIG. 2B, and FIG. 2C and the constitutions of the modification examples of FPC 106 illustrated in FIG. 7A, FIG. 7B, FIG. 7C, FIG. 8, FIG. 9A, FIG. 9B, FIG. 9C, FIG. 10, FIG. 11A, FIG. 11B, FIG. 11C, FIG. 12, FIG. 13A, FIG. 13B, FIG. 13C, FIG. 14, FIG. 15A, FIG. 15B, FIG. 15C, FIG. 16, FIG. 17A, FIG. 17B, FIG. 17C, and FIG. 18 not only can be singly used as separate FPC, but also can be used as one combined FPC obtained by appropriately combining these constitutions.

100 . . . optical modulator, 102, 2002 . . . optical modulation element, 104, 2004 . . . package case, 106, 700, 900, 1100, 1300, 1500, 1700, 2006 . . . FPC, 108, 110, 2008, 2010 . . . optical fiber, 120, 122, 124, 126, 2020, 2022, 2024, 2026 . . . lead pin for signals, 202, 204 . . . side, 210, 212, 214, 216, 240, 242, 244, 246, 410, 412, 414, 416, 710, 712, 714, 716, 740, 742, 744, 746, 910, 912, 914, 916, 940, 942, 944, 946, 1110, 1112, 1114, 1116, 1140, 1142, 1144, 1146, 1310, 1312, 1314, 1316, 1340, 1342, 1344, 1346, 1510, 1512, 1514, 1516, 1540, 1542, 1544, 1546, 1710, 1712, 1714, 1716, 1740, 1742, 1744, 1746, 2110, 2112, 2114, 2116, 2210, 2212, 2214, 2216 . . . pad, 250a, 250b, 250c, 252a, 252b, 252c, 254a, 254b, 254c, 256a, 256b, 256c, 750a, 750b, 752a, 752b, 754a, 754b, 756a, 756b, 950a, 950b, 952a, 952b, 954a, 954b, 956a, 956b, 1150a, 1150b, 1152a, 1152b, 1154a, 1154b, 1156a, 1156b, 1350a, 1350b, 1350c, 1352a, 1352b, 1352c, 1354a, 1354b, 1354c, 1356a, 1356b, 1356c, 1550a, 1550b, 1550c, 1552a, 1552b, 1552c, 1554a, 1554b, 1554c, 1556a, 1556b, 1556c, 1750a, 1750b, 1750c, 1752a, 1752b, 1752c, 1754a, 1754b, 1754c, 1756a, 1756b, 1756c . . . through-hole, 220, 222, 224, 226, 2120, 2122, 2124, 2126 . . . through-hole for signals, 230, 232, 234, 236, 2130, 2132, 2134, 2136 . . . wire patterns, 270, 272, 274, 276, 770, 772, 774, 776, 970, 972, 974, 976, 1170, 1172, 1174, 1176, 1370, 1372, 1374, 1376, 1570, 1572, 1574, 1576, 1770, 1772, 1774, 1776 . . . metal film, 780, 782, 784, 786, 980, 982, 984, 986, 1180, 1182, 1184, 1186, 1380, 1382, 1384, 1386, 1580, 1582, 1584, 1586, 1780, 1782, 1784, 1786 . . . recess portion, 400, 2200 . . . circuit substrate, 402, 2202 . . . base, 1900 . . . optical transmission device, 1904 . . . light source, 1906 . . . modulation signal generation portion, 1908 . . . modulation data generation portion.

What is claimed is:

1. An optical modulator comprising:
a flexible printed circuit performing an electrical connection with a circuit substrate,
wherein the flexible printed circuit includes
a plurality of first pads provided on one surface of the flexible printed circuit along one edge of the flexible printed circuit,
a plurality of second pads provided on the other surface of the flexible printed circuit at locations that respectively correspond to the plurality of first pads, and
a plurality of metal films provided at locations that respectively correspond to the first pads on a side surface of the flexible printed circuit along the one edge of the flexible printed circuit.

2. The optical modulator according to claim 1,
wherein each of the plurality of metal films is constituted of one metal film connecting one first pad of the plurality of first pads and one second pad of the plurality of second pads which correspond to each other, or
each of the plurality of metal films is constituted of a plurality of metal films including a metal film connected to the corresponding first pad and a metal film connected to the corresponding second pad.

3. The optical modulator according to claim 1,
wherein the flexible printed circuit includes through-holes or vias that thermally connect the plurality of first pads to the plurality of second pads.

4. The optical modulator according to claim 1,
wherein a recess portion having a semi-circular shape in a plan view is provided on the side surface of the flexible printed circuit provided with the plurality of metal films, and
the plurality of metal films is provided in a part or whole of an inner surface of the recess portion.

5. The optical modulator according to claim 1,
wherein a recess portion having a semi-circular shape in a plan view is provided on the side surface of the flexible printed circuit provided with the plurality of metal films, and
the plurality of metal films is provided in a region of the side surface including the recess portion.

6. The optical modulator according to claim 1,
wherein a recess portion having a rectangular shape in a plan view is provided on the side surface of the flexible printed circuit provided with the plurality of metal films, and
the plurality of metal films is provided in a part or whole of the inner surface of the recess portion.

7. The optical modulator according to claim 6,
wherein the recess portion having the rectangular shape has a width equal to, or wider, narrower than a width of each of the plurality of first pads.

8. The optical modulator according to claim 1,
wherein thicknesses of each of the plurality of first pads and each of the plurality of second pads are 10 µm or more and 60 µm or less.

9. An optical transmission device comprising:
the optical modulator according to claim 1; and
an electronic circuit that outputs electrical signals for causing modulation operations in the optical modulator.

10. The optical modulator according to claim 1,
wherein each of the plurality of metal films is correspond to a terminal end of each first pad on the side surface of the flexible printed circuit along the one edge of the flexible printed circuit.

* * * * *